(12) United States Patent
Kozaki

(10) Patent No.: US 12,158,155 B2
(45) Date of Patent: Dec. 3, 2024

(54) ESTIMATION DEVICE, VACUUM VALVE, AND VACUUM PUMP

(71) Applicant: SHIMADZU CORPORATION, Kyoto (JP)

(72) Inventor: Junichiro Kozaki, Kyoto (JP)

(73) Assignee: SHIMADZU CORPORATION, Kyoto (JP)

(*) Notice: Subject to any disclaimer, the term of this patent is extended or adjusted under 35 U.S.C. 154(b) by 533 days.

(21) Appl. No.: 17/491,588

(22) Filed: Oct. 1, 2021

(65) Prior Publication Data

US 2022/0235787 A1    Jul. 28, 2022

(30) Foreign Application Priority Data

Jan. 25, 2021  (JP) .................................. 2021-009873

(51) Int. Cl.
*F16K 31/02* (2006.01)
*F04D 19/04* (2006.01)
(Continued)

(52) U.S. Cl.
CPC ......... *F04D 27/001* (2013.01); *F04D 19/042* (2013.01); *F04D 27/008* (2013.01);
(Continued)

(58) Field of Classification Search
CPC .... F04D 27/001; F04D 19/042; F04D 27/008; F16K 31/02; F16K 37/0083;
(Continued)

(56) References Cited

U.S. PATENT DOCUMENTS 10,443,600 B2 * 10/2019 Kozaki ................. F04D 17/168
2013/0071258 A1    3/2013 Enomoto
(Continued)

FOREIGN PATENT DOCUMENTS

CN    107795498 A    3/2018
CN    109630446 A    4/2019
(Continued)

OTHER PUBLICATIONS

Office Action for corresponding CN Application No. 202110946705. 2, dated Apr. 3, 2023, with English language machine translation.
(Continued)

*Primary Examiner* — P. Macade Nichols
(74) *Attorney, Agent, or Firm* — Renner, Otto, Boisselle & Sklar, LLP

(57) ABSTRACT

An estimation device for estimating a process gas condition in a system for pumping gas from a vacuum chamber into which the gas is injected to perform a treatment process by a vacuum pump attached to the vacuum chamber through a vacuum valve, comprises: a computer having a processor and a memory, wherein the computer estimates a first process gas condition including an injected gas type and a gas flow rate based on correlation data between a valve body opening degree of the vacuum valve and an effective exhaust speed of the system regarding a predetermined gas type and a chamber pressure of the vacuum chamber.

16 Claims, 8 Drawing Sheets

(51) Int. Cl.
*F04D 27/00* (2006.01)
*F16K 37/00* (2006.01)
*H01L 21/67* (2006.01)

(52) U.S. Cl.
CPC .......... *F16K 31/02* (2013.01); *F16K 37/0083* (2013.01); *H01L 21/67253* (2013.01); *F05D 2210/12* (2013.01); *F05D 2260/607* (2013.01); *F05D 2260/80* (2013.01)

(58) Field of Classification Search
CPC ........... H01L 21/67253; F05D 2210/12; F05D 2260/607; F05D 2260/80
See application file for complete search history.

(56) References Cited

U.S. PATENT DOCUMENTS

| | | |
|---|---|---|
| 2015/0114101 A1 | 4/2015 | Enomoto |
| 2018/0066669 A1 | 3/2018 | Tsubokawa |
| 2019/0107110 A1* | 4/2019 | Nakamura ............. F04D 19/04 |
| 2022/0220969 A1 | 7/2022 | Tamai |

FOREIGN PATENT DOCUMENTS

| | | |
|---|---|---|
| WO | 2011145444 A1 | 11/2011 |
| WO | 2013161399 A1 | 10/2013 |
| WO | 2020194852 A1 | 10/2020 |

OTHER PUBLICATIONS

Office Action for corresponding CN Application No. 202110946705.2, dated Nov. 2, 2023, with English language machine translation.

* cited by examiner

ESTIMATION DEVICE, VACUUM VALVE, AND VACUUM PUMP

BACKGROUND OF THE INVENTION

1. Technical Field

The present invention relates to an estimation device configured to estimate process conditions to be processed in a vacuum device and a vacuum valve and a vacuum pump having the estimation device.

2. Background Art

A turbo-molecular pump is used as an exhaust pump for various semiconductor manufacturing devices, but a reactive product is accumulated inside the pump upon gas pumping in, e.g., an etching process. In the turbo-molecular pump, a rotor is rotated at a high speed relative to a stator through a gap. However, rotation operation cannot be performed in some cases because the reactive product upon etching is accumulated in the pump and is eventually fixed with the clearance between the rotor and the stator being filled with the reactive product. Regarding such reactive product accumulation, the technique of evaluating an accumulation amount from the amount of increase in a motor current value has been proposed as described in, e.g., Patent Literature 1 (WO 2011/145444 A) and Patent Literature 2 (WO 2013/161399 A). In the technique described in Patent Literature 1, a health check mode in which a known gas type and a constant gas flow rate are set is specially provided, and the accumulation amount is evaluated based on the motor current value measured in the health check mode.

In the technique described in Patent Literature 2, the method for detecting product accumulation is proposed. The motor current value is measured without providing a special condition such as the health check mode described in Patent Literature 1, and only the motor current value equal to or greater than a set value is employed among the measured motor current values. Then, averages per unit time are calculated and arranged in chronological order, and a difference value from an initial motor current value at the start of use is obtained to sense whether or not such a value has exceeded a preset threshold. In this manner, product accumulation is detected. Further, the motor current value is measured only in time for which the motor current value is stable in a rated rotation mode, and threshold determination as described above is performed.

In a case where the product accumulation amount is evaluated by comparison of a temporal increase in the motor current value with the threshold as described above, a change in the motor current value due to a condition (e.g., a change in a gas flow rate) different from product accumulation is also measured as long as the substantially-same pump exhaust conditions are not employed upon motor current value measurement, leading to a problem that the accumulation amount is not properly evaluated.

In the technique described in Patent Literature 1, the motor current value is measured in the health check mode under the same conditions, and therefore, the above-described problem is not caused. However, a manufacturing process needs to be temporarily stopped on a regular basis to provide a health check mode period. Further, a burden such as installation of a gas facility for the health check mode, addition of an operation mode to a device, and a change in such an operation mode is caused.

Regarding measurement and arithmetic processing of the motor current value in the technique described in Patent Literature 2, current value measurement is performed under the conditions of "only in time for which the motor current value is stable in a rated rotation mode" and "equal to or greater than a set value," and the arithmetic processing is performed under the conditions of "averages per unit time are calculated," "arranged in chronological order," and "a difference value from an initial motor current value at the start of use is obtained." In this manner, even if exhaust conditions such as a gas type and a gas flow rate are unknown, variation in motor current measurement conditions is eventually reduced as much as possible. However, a process such as etching or film formation is performed in the device according to various process condition recipes, and therefore, the acquired motor current values include current values measured under various conditions. For this reason, practical-level sorting extraction conditions cannot be provided even by the above-described arithmetic processing.

SUMMARY OF THE INVENTION

An estimation device for estimating a process gas condition in a system for pumping gas from a vacuum chamber into which the gas is injected to perform a treatment process by a vacuum pump attached to the vacuum chamber through a vacuum valve, comprises: a computer having a processor and a memory. The computer estimates a first process gas condition including an injected gas type and a gas flow rate based on correlation data between a valve body opening degree of the vacuum valve and an effective exhaust speed of the system regarding a predetermined gas type and a chamber pressure of the vacuum chamber.

The computer includes a state determination section configured to determine whether or not the chamber pressure is in a state taken as an equilibrium state in which the chamber pressure has converged to a target pressure in a process, and the computer estimates the first process gas condition in the state taken as the equilibrium state.

The state determination section determines, in addition to determination of the state taken as the equilibrium state, whether or not the chamber pressure is in a pressure response transient state upon adjustment to the target pressure. The computer estimates multiple second process gas conditions equivalent to the injected gas type and the gas flow rate in the transient state. The computer estimates, based on the multiple second process gas conditions and the first process gas condition in the state taken as the equilibrium state, a third process gas condition equivalent to the injected gas type and the gas flow rate in the equilibrium state in which the chamber pressure has converged to the target pressure in the process.

The computer further estimates, as a fourth process gas condition, an event time length equivalent to time required for the treatment process and/or a process pressure.

The computer further estimates, as a fifth process gas condition, information indicating whether or not the chamber pressure is in the equilibrium state.

The computer estimates the first process gas condition and a fifth process gas condition indicating whether or not the chamber pressure is in the equilibrium state. The computer generates, in chronological order, multiple data sets including the estimated process gas conditions and a state characteristic value indicating an operation state of the vacuum pump. The computer extracts, from the multiple data sets, only a data set of which the fifth process gas condition indicates the equilibrium state. The computer sets, for a predetermined process gas condition or multiple predetermined process gas conditions of the multiple process gas conditions included in the extracted data set, a classification framework that the process gas condition is taken as a state substantially identical to a predetermined state and classifies the extracted data set as the classification framework.

The computer estimates at least one of the first process gas condition, the second process gas conditions, and the third process gas condition and a fifth process gas condition indicating whether or not the chamber pressure is in the equilibrium state. The computer generates, in chronological order, multiple data sets including the estimated process gas conditions and a state characteristic value indicating an operation state of the vacuum pump. The computer extracts, from the multiple data sets, only a data set of which the fifth process gas condition indicates the equilibrium state. The computer sets, for a predetermined process gas condition or multiple predetermined process gas conditions of the multiple process gas conditions included in the extracted data set, a classification framework that the process gas condition is taken as a state substantially identical to a predetermined state and classifies the extracted data set as the classification framework.

The computer estimates at least one of the first process gas condition or the fourth process gas condition and a fifth process gas condition indicating whether or not the chamber pressure is in the equilibrium state. The computer generates, in chronological order, multiple data sets including the estimated process gas conditions and a state characteristic value indicating an operation state of the vacuum pump. The computer extracts, from the multiple data sets, only a data set of which the fifth process gas condition indicates the equilibrium state. The computer sets, for a predetermined process gas condition or multiple predetermined process gas conditions of the multiple process gas conditions included in the extracted data set, a classification framework that the process gas condition is taken as a state substantially identical to a predetermined state and classifies the extracted data set as the classification framework.

The state characteristic value is a current value of a motor configured to rotatably drive a pump rotor. The computer arranges multiple data sets classified as an identical classification framework in chronological order, and estimates a product accumulation amount in the vacuum pump based on a temporal change in the state characteristic value included in the data sets arranged in chronological order.

The computer generates, in chronological order, multiple data sets including the first process gas condition, an event time length, and the fifth process gas condition. The computer extracts, from the multiple data sets, only a data set of which the fifth process gas condition indicates the equilibrium state. The computer estimates a time integration amount of the first process gas condition based on the event time length and the fifth process gas condition included in the extracted data set. The computer evaluates a creep strain amount of a pump rotor of the vacuum pump based on the estimated time integration amount.

A vacuum valve provided between a vacuum chamber in which a treatment process is performed and a vacuum pump, comprises: the estimation device. A product accumulation state in the vacuum pump is determined based on a product accumulation amount estimated by the estimation device.

A vacuum valve comprises: the estimation. The computer acquires the first process gas condition, a fifth process gas condition indicating whether or not the chamber pressure is in the equilibrium state, and a state characteristic value indicating an operation state of the vacuum pump. The computer generates, in chronological order, multiple data sets including the first process gas condition, the fifth process gas condition, and the state characteristic value indicating the operation state. The computer extracts, from the multiple data sets, only a data set of which the fifth process gas condition indicates the equilibrium state. The computer sets, for a predetermined process gas condition or multiple predetermined process gas conditions of the multiple process gas conditions included in the extracted data set, a classification framework that the process gas condition is taken as a state substantially identical to a predetermined state and classifies the extracted data set as the classification framework.

A vacuum pump comprises: a pump rotor to be rotatably driven by a motor; and the estimation device. A product accumulation state in the vacuum pump is determined based on a product accumulation amount estimated by the estimation device.

A vacuum pump comprises: the estimation device. The computer acquires the first process gas condition and a fifth process gas condition indicating whether or not the chamber pressure is in the equilibrium state. The computer generates, in chronological order, multiple data sets including the first process gas condition, the fifth process gas condition, and a state characteristic value indicating an operation state of the vacuum pump. The computer extracts, from the multiple data sets, only a data set of which the fifth process gas condition indicates the equilibrium state. The computer sets, for a predetermined process gas condition or multiple predetermined process gas conditions of the multiple process gas conditions included in the extracted data set, a classification framework that the process gas condition is taken as a state substantially identical to a predetermined state and classifies the extracted data set as the classification framework.

According to the estimation device of the present invention, estimation values of process gas conditions including information on an injected gas type and a gas flow rate can be estimated. According to the vacuum valve of the present invention, a product accumulation state in the vacuum pump can be determined based on a product accumulation amount estimated by the estimation device. Moreover, only a data set indicating an equilibrium state can be extracted from multiple data sets including the process gas conditions and a state characteristic value, and the extracted data set can be classified as a classification framework. According to the vacuum pump of the present invention, the product accumulation state in the vacuum pump can be determined based on the product accumulation amount estimated by the estimation device. Moreover, only the data set indicating the equilibrium state can be extracted from the multiple data sets including the process gas conditions and the state characteristic value, and the extracted data set can be classified as the classification framework.

DETAILED DESCRIPTION OF THE EXEMPLARY EMBODIMENTS

Hereinafter, modes for carrying out the present invention will be described with reference to the figures.

First Embodiment

Figure 1:
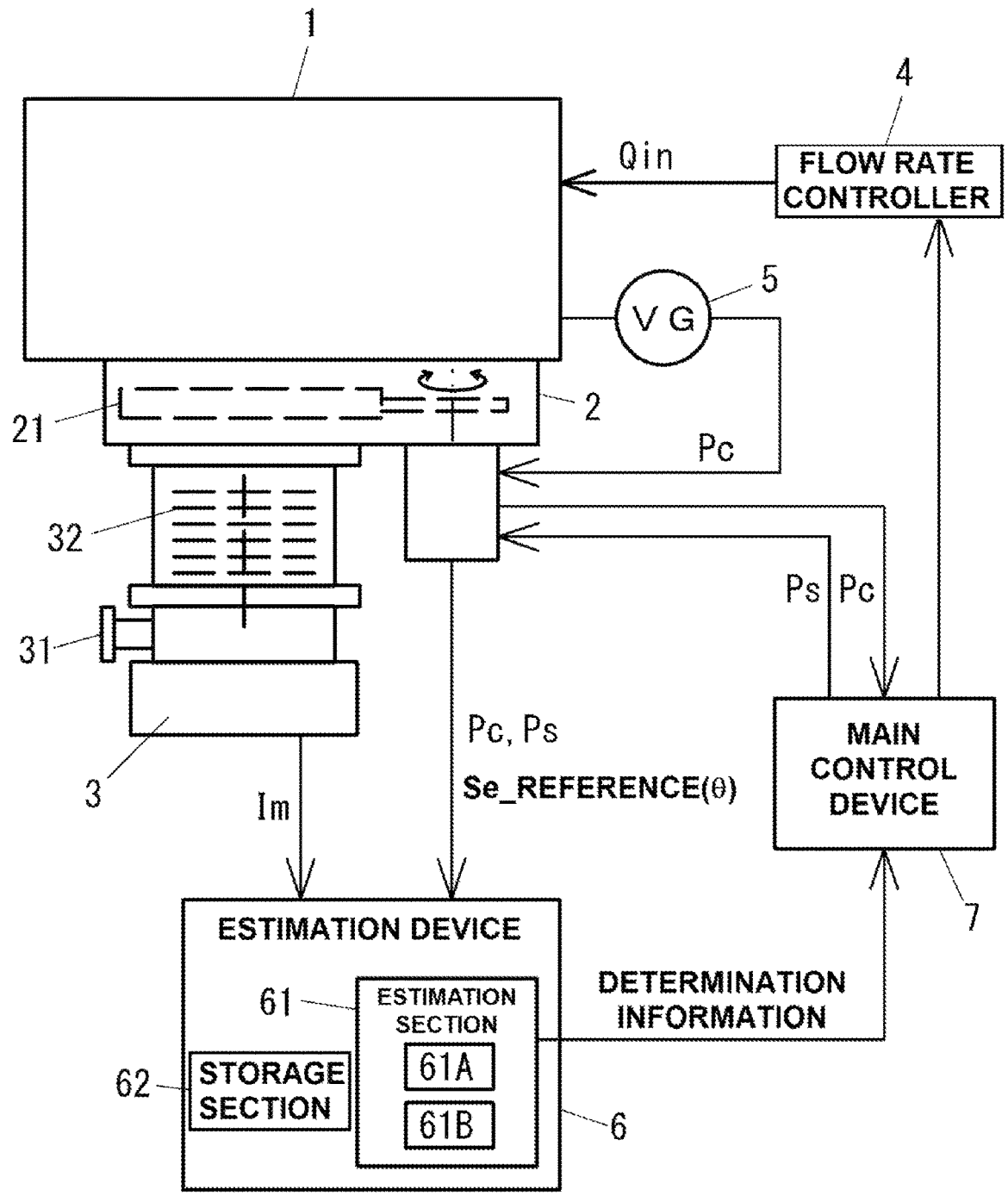
FIG. 1 is a block diagram showing a schematic configuration of a vacuuming device.

FIG. 1 is a block diagram showing a schematic configuration of a vacuuming device 100. Examples of the vacuuming device 100 include an etching device and a film formation device. The vacuuming device 100 includes a vacuum chamber 1 in which a treatment process is performed, a vacuum valve 2 attached to the vacuum chamber 1, a vacuum pump 3 attached to the vacuum chamber 1 through the vacuum valve 2, a flow rate controller 4 configured to control the flow rate of gas injected into the vacuum chamber 1, a vacuum meter 5 configured to measure the pressure of the vacuum chamber 1, an estimation device 6, and a main control device 7 configured to control the vacuuming device 100.

The vacuum valve 2 is an automatic pressure control valve configured to automatically adjust the opening degree θ of a valve body 21 based on a target pressure Ps input from the main control device 7 and a chamber pressure Pc input from the vacuum meter 5 such that the chamber pressure Pc reaches the target pressure Ps. The vacuum valve 2 outputs the chamber pressure Pc measured by the vacuum meter 5 to the main control device 7. The vacuum pump 3 of FIG. 1 is a turbo-molecular pump, and a pump rotor 32 thereof is rotated at a high speed by a motor. An auxiliary pump (not shown) such as a dry pump is connected to an exhaust port 31. A correlation data Se_reference(θ) as an effective exhaust speed regarding reference gas is stored in the vacuum valve 2. The chamber pressure Pc and the target pressure Ps are constantly input to the estimation device 6 from the vacuum valve 2, and the correlation data Se_reference(θ) is also input to the estimation device 6. The correlation data Se_reference(θ) as a relationship between the effective exhaust speed for the known reference gas and the opening degree may be initially transmitted and input only once. Moreover, a motor current value Im is, as a state characteristic value with a high correlation with a product accumulation amount, input to the estimation device 6 from the vacuum pump 3.

The estimation device 6 includes an estimation section 61 and a storage section 62. In a data set generation section 61A of the estimation section 61, process conditions in the vacuum chamber 1 are estimated based on the chamber pressure Pc, the target pressure Ps, and the correlation data Se_reference(θ) input from the vacuum valve 2, and a process information data set including a group of data regarding process gas conditions is generated. Moreover, the data set generation section 61A generates, in addition to generation of the above-described process information data set, an accumulation information data set obtained by addition of the motor current value Im input from the vacuum pump 3 to the process information data set. In an accumulation amount determination section 61B of the estimation section 61, the accumulation information data set to be used for accumulation amount determination is extracted, and an accumulation amount is determined based on the extracted accumulation information data set. Accumulation amount determination information is output from the estimation device 6, and is output to the main control device 7 in an example shown in FIG. 1.

The estimation device 6 includes, for example, an arithmetic processing device of a computer (e.g., a microcomputer) having a processor (e.g., a CPU), a memory (e.g., a ROM and a RAM), a peripheral circuit and the like, and implements the function of the estimation section 61 by a software program stored in the ROM. The memory of the microcomputer forms the storage section 62. Alternatively, a digital arithmetic processor such as a field programmable gate array (FPGA) and a peripheral circuit thereof may form the storage section 62.

As described above, a reactive product is accumulated in the vacuum pump 3 due to process gas pumping, and the motor current value Im of the vacuum pump 3 has been known as the characteristic value with the high correlation with the product accumulation amount. The motor current value Im depends on the process conditions in the vacuum chamber 1 targeted for gas pumping by the vacuum pump 3, and therefore, process conditions upon current value measurement also need to be taken into consideration in a case where the motor current value Im is used as the state characteristic value indicating the product accumulation amount.

Figure 2:
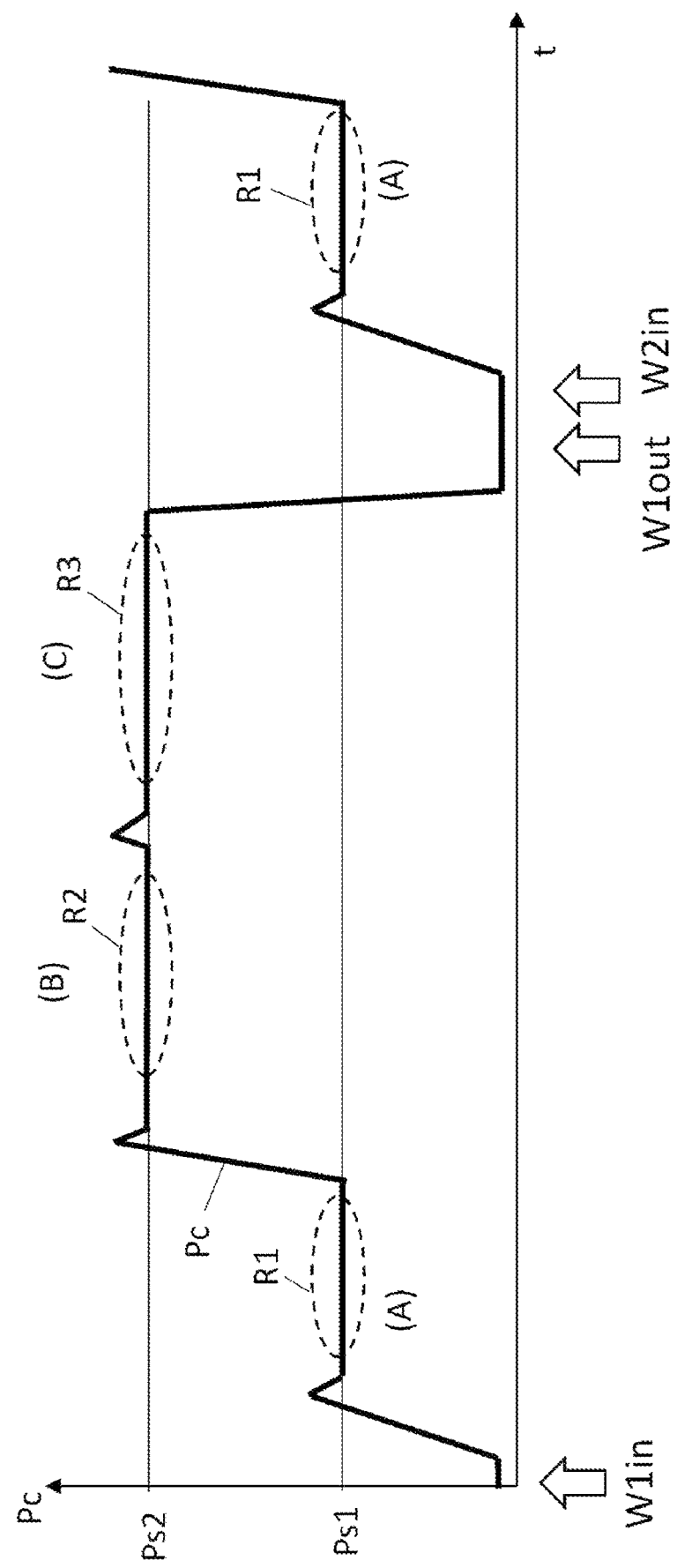
FIG. 2 is a graph schematically showing a relationship between a treatment process and a chamber pressure Pc.

FIG. 2 is a graph schematically showing a relationship between the treatment process (also called a process event) and the chamber pressure Pc. An example shown in FIG. 2 shows a case where three types of treatment processes (e.g., an etching process and a film formation process) indicated by A, B, and C are repeatedly performed for wafers loaded into the vacuum chamber 1. When loading of an unprocessed wafer is completed at timing W1in, the process A, the process B, and the process C are sequentially performed for such a wafer. After unloading (W1out) of the processed wafer and loading (W2in) of an unprocessed wafer, the process A, the process B, and the process C are sequentially performed for the loaded wafer. The process A started after injection of process gas after wafer loading is performed in a state (an equilibrium state) R1 in which the chamber pressure Pc is stable at a target pressure Ps1. Similarly, the process B is performed in a state (an equilibrium state) R2 in which the chamber pressure Pc is stable at a target pressure Ps2. Moreover, the same target pressure Ps2 as that of the process B is employed for the process C, but the gas is substituted with another type of injected gas at the timing of switching the process B to the process C. Thus, the process C is performed in a state (an equilibrium state) R3 in which the chamber pressure Pc is stable at the target pressure Ps2 again after having temporarily deviated from the equilibrium state. Normally, the etching or film formation process is performed in a state in which the chamber pressure Pc reaches the target pressure Ps and becomes stable at a certain pressure through a transient response process in automatic pressure adjustment.

The timing of maintenance for accumulated substance removal is determined according to the amount of increase in the motor current value Im, and it is determined that the maintenance timing has come in a case where the amount of increase in the current with respect to the motor current value Im in a state in which no reactive product is accumulated exceeds a predetermined threshold. When the reactive product is accumulated in the pump, a load on the motor configured to rotatably drive the pump rotor 32 increases. However, the motor current value Im also changes depending on a change in a gas load while the process events are being repeatedly performed. Thus, the measured motor current value Im includes a current value change due to gas load fluctuation and a current value change due to an accumulation amount increase. For this reason, as long as determination is not made based on the motor current value Im acquired under the same gas load conditions, accumulation amount determination according to the amount of increase in the current value is not properly performed. For example, if sampling data is mixed with the motor current value Im measured in the state R1 of FIG. 2, the motor current value Im measured in the state R2, and the motor current value Im measured in the state R3, the accumulation amount is not accurately evaluated.

In the present embodiment, the process information data set including the group of data regarding the process gas conditions is added to the motor current value Im so that the accumulation amount can be determined according to the motor current value Im under the same process gas conditions (the gas load conditions).

[1. Correlation Data Se_Reference($\theta$)]

First, the correlation data Se_reference($\theta$) stored in the vacuum valve 2 will be described. As shown in FIG. 1, a process gas pumping system configured to perform a semiconductor process (e.g., dry etching) includes at least the vacuum chamber 1 in which the treatment process is performed, a gas injection system (e.g., the flow rate controller 4), the vacuum meter 5, the vacuum valve 2, and the vacuum pump 3 (including the auxiliary pump). The effective exhaust speed Se of an exhaust system is influenced by the structure of the vacuum chamber 1, but is almost set according to the conductance of the vacuum valve 2 and the exhaust speed of the vacuum pump 3 on a valve downstream side. The conductance of the vacuum valve 2 varies according to the valve body opening degree $\theta$, and therefore, the effective exhaust speed Se is represented as the function of the valve body opening degree $\theta$. Note that the effective exhaust speed Se depends not only on the opening degree $\theta$ but also on an injected gas flow rate Qin, but the influence of the injected gas flow rate Qin is small. Thus, in the present embodiment, the effective exhaust speed Se will be described only as the function of the opening degree $\theta$ such as Se($\theta$).

In the present embodiment, the correlation data Se_reference($\theta$) between the valve body opening degree $\theta$ of the vacuum valve 2 and the effective exhaust speed Se regarding the type of gas (e.g., Ar gas) as the known reference is stored in advance in the storage section 62 of the estimation device 6. For example, as the method for acquiring the correlation data Se_reference($\theta$), the correlation data Se_reference($\theta$) is obtained in such a manner that the type of gas (e.g., Ar gas) as the known reference is injected into the gas pumping system configured such that the vacuum valve 2 and the vacuum pump 3 are attached to a predetermined vacuum chamber and the effective exhaust speed Se is measured for various valve body opening degrees $\theta$. The correlation data Se_reference($\theta$) is acquired before shipment to a user, and is stored in the storage section 62 of the estimation device 6. Alternatively, the predetermined type of reference gas is injected at a predetermined gas flow rate in the user's gas pumping system, and the effective exhaust speed Se is similarly actually measured and is stored in the storage section 62 of the estimation device 6.

Note that the correlation data Se_reference($\theta$) is data also used in automatic pressure adjustment control of the vacuum valve 2, and therefore, is normally stored in the vacuum valve 2. Thus, the correlation data Se_reference($\theta$) stored in the vacuum valve 2 may be data-transmitted to the estimation device 6 via a communication function as shown in FIG. 1. Such data transmission may be performed only once.

[2. Process Gas Conditions]

Next, the process gas conditions will be described. The process conditions include a high-frequency power required for plasma excitation and the like, and a reference gas equivalent flow rate Qin_a, a gas type relative value a, the gas flow rate Qin, the process pressure Ps, and an event time length Time_spn are assumed herein as the process gas conditions associated with the injected gas. Note that the reference gas equivalent flow rate Qin_a is an amount depending on the gas type and the gas flow rate. According to the situation, the reference gas equivalent flow rate Qin_a is employed in some cases, and the gas type relative value a and the gas flow rate Qin are employed in some other cases. Further, even in a case where the above-described process gas conditions can be estimated, such timing is not preferable as measurement timing in some cases. Specifically, timing when the chamber pressure Pc is in the equilibrium state is preferable, and timing when the chamber pressure Pc is in a transient state is not preferable. Thus, in addition to the above-described process gas conditions, recommended measurement timing information flag_OK is also preferably employed as the process gas conditions. The estimation device 6 generates, as the process information data set with the set of the above-described multiple process gas conditions, [a, Qin, Ps, Time_spn, flag_OK] or [Qin_a, Ps, Time_spn, flag_OK]. Five or four process gas conditions are herein taken as a set, but the process gas conditions may be selected according to the situation. For example, only one process gas condition may be used, and even when only one process gas condition is included, such a condition will be referred to as the process information data set.

(1-1. Process Pressure Ps)

Figure 3:
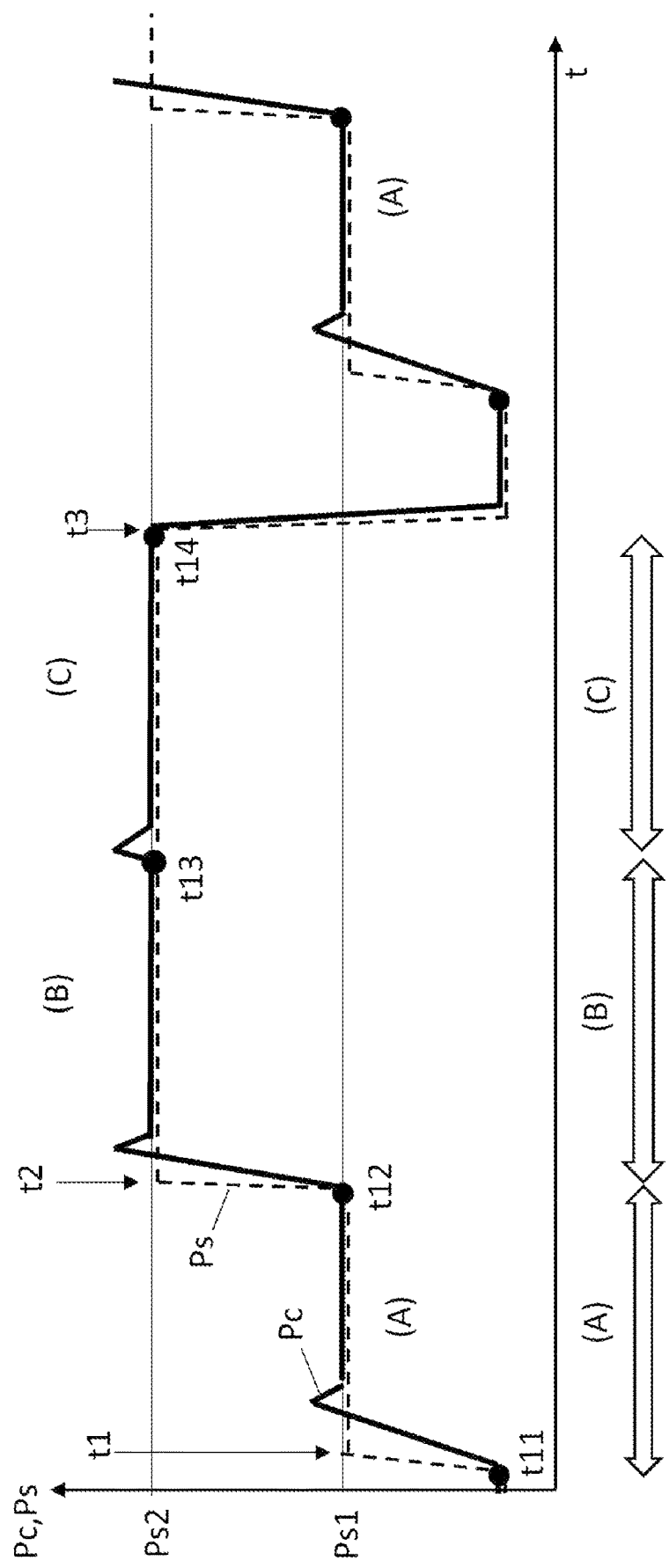
FIG. 3 is a graph for describing a process pressure Ps.

The process pressure Ps is, as the target pressure in automatic pressure adjustment, set and input from the main control device 7 to the vacuum valve 2. FIG. 3 shows, by a dashed line, a change in the target pressure Ps input to the estimation device 6 in association with a change in the chamber pressure Pc as shown in FIG. 2. The target pressure Ps is input, and the chamber pressure Pc is adjusted to the target pressure Ps by automatic pressure adjustment of the vacuum valve 2. Normally, after the transient response process in automatic pressure adjustment, the etching or film formation process (the process events A, B, C of FIG. 3) is performed in a state in which the chamber pressure Pc reaches the target pressure Ps and becomes stable at a certain pressure. Thus, the chamber pressure Pc reaching the process pressure (the target pressure) Ps in the substantially equilibrium state can be employed as the process gas condition. That is, the process pressure Ps1 is generated as the process gas condition in a period (the process event A) in which Pc=Ps1 is satisfied in FIG. 3, the process pressure Ps2 is generated as the process gas condition in a period (the process events B, C) in which Pc=Ps2 is satisfied, and no process gas condition (the process pressure Ps) is generated in other periods. The other periods described herein are high-vacuum periods in which loading and unloading of a wafer are performed and no process is performed. Note that FIG. 3 also shows the dashed line of the target pressure Ps in these periods for the sake of convenience, but automatic pressure adjustment is not necessarily performed and the valve body is driven to fully open the valve to forcibly pump the process gas remaining in the vacuum chamber.

(1-2. Event Time Length Time_spn)

The event time length Time_spn is a time length from the start to the end of the process event. For example, the event time length Time_spn is estimated according to the presence or absence of a change in the target pressure Ps or the presence or absence of deviation from the equilibrium state. In an example shown in FIG. 3, the target pressure Ps changes from a high vacuum to Ps1 at t=t1 and changes from Ps1 to Ps2 at t=t2, t=t1 being taken as the start of the event A and t=t2 being taken as the end of the process event A. Thus, Time_spn=t2−t1 is the event time length of the process event A for the target pressure Ps1. On the other hand, t=t2 is also taken as the end of the process event A and the start of the subsequent process event B, but the target pressure Ps remains at Ps2 without change at the end of the process event B. Thus, the end of the process event B is not known only according to a change in the target pressure Ps. Thus, in a case where there is no change in the target pressure Ps, the end of the process event B is estimated from deviation of the chamber pressure Pc from the target pressure Ps2. In FIG. 3, timing at t=t13 can be taken as the end of the process event B, and therefore, Time_spn=t13−t2 is the event time length of the process event B.

The timing at t=t13 is taken as the end of the process event B, and is also taken as the start of the subsequent process event C. The end of the process event C is t=t3 or t=t14 in FIG. 3. The end is t=t3 in the case of estimation from a change in the target pressure Ps from Ps2 to a high vacuum, and is t=t14 in the case of estimation from deviation from the equilibrium state. Since the end is at the substantially same time in any case, Time_spn=t3−t13 is the event time length of the process event C for the target pressure Ps2 when t=t3 is taken as the end of the process event C.

As described above, the chamber pressure Pc right before the end of the event is normally in the equilibrium state in which the chamber pressure Pc is stable at the target pressure Ps as the process pressure, and therefore, the process event is also a period from the equilibrium state to the equilibrium state. For example, in a case where a high-vacuum state right before the process event A of FIG. 3 is also taken as an equilibrium state, a period (t12−t11) from such an equilibrium state (t=t11) to the equilibrium state (t=t12) at the end stage of the process event A is estimated as the event time length Time_spn of the process event A. Moreover, a period (t13−t12) from the equilibrium state (t=t12) at the end stage of the process event A to the equilibrium state (t=t13) at the end stage of the subsequent process event B is estimated as the event time length Time_spn of the process event B. Further, a period (t14−t13) from the equilibrium state (t=t13) at the end stage of the process event B to the equilibrium state (t=t14) at the end stage of the subsequent process event C is estimated as the event time length Time_spn of the process event C.

Note that normally in a case where the process event starts or ends in a state in which the target pressure Ps is constant without change, the chamber pressure Pc temporarily deviates from the equilibrium state due to an injected gas change as shown in FIG. 3. That is, the chamber pressure Pc deviates from the target pressure Ps once, and thereafter, converges to the target pressure Ps again and is brought into the equilibrium state. Thus, the start or the end is determined according to the presence or absence of deviation from the equilibrium state as described above, and in this manner, the event time length Time_spn is estimated. Note that in a case where the injected gas change is small, there might be almost no deviation from the equilibrium state. In such a case, the process gas conditions are determined from a change in the reference gas equivalent flow rate Qin_a as described later.

Note that the event time length Time_spn is unknown until the end point is estimated after the start point has been estimated. That is, the event time length Time_spn is updated with a time value obtained by subtraction of the start time from the current time every second, and is fixed after updating has been stopped at the end point.

(1-3. Gas Type Relative Value a, Gas Flow Rate Qin)

Figure 4:
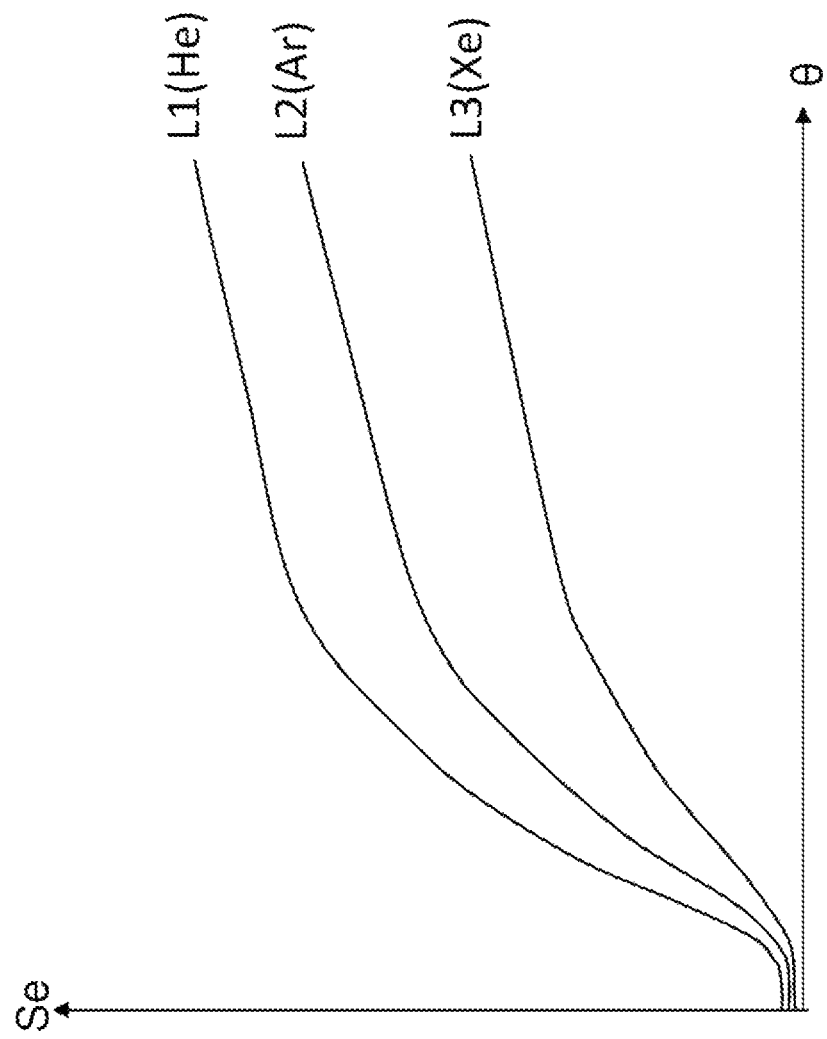
FIG. 4 is a graph showing a relationship between a valve body opening degree θ and an effective exhaust speed Se(θ)

The effective exhaust speed $Se(\theta)$ is in such a relationship that the effective exhaust speed $Se(\theta)$ monotonically increases in association with the valve body opening degree $\theta$ as shown in FIG. 4. In FIG. 4, lines L1, L2, L3 indicate effective exhaust speeds $Se(\theta)$ for helium gas, argon gas, and xenon gas. In a case where the influence of the structure of the vacuum chamber 1 on the effective exhaust speed $Se(\theta)$ can be ignored, the effective exhaust speed $Se(\theta)$ is determined according to the exhaust speed Sp of the vacuum pump 3 and the conductance $Cv(\theta)$ of the vacuum valve 2 as in Expression (1) below.

$$Se(\theta)=1/(1/Cv(\theta)+1/Sp) \tag{1}$$

Figure 5:
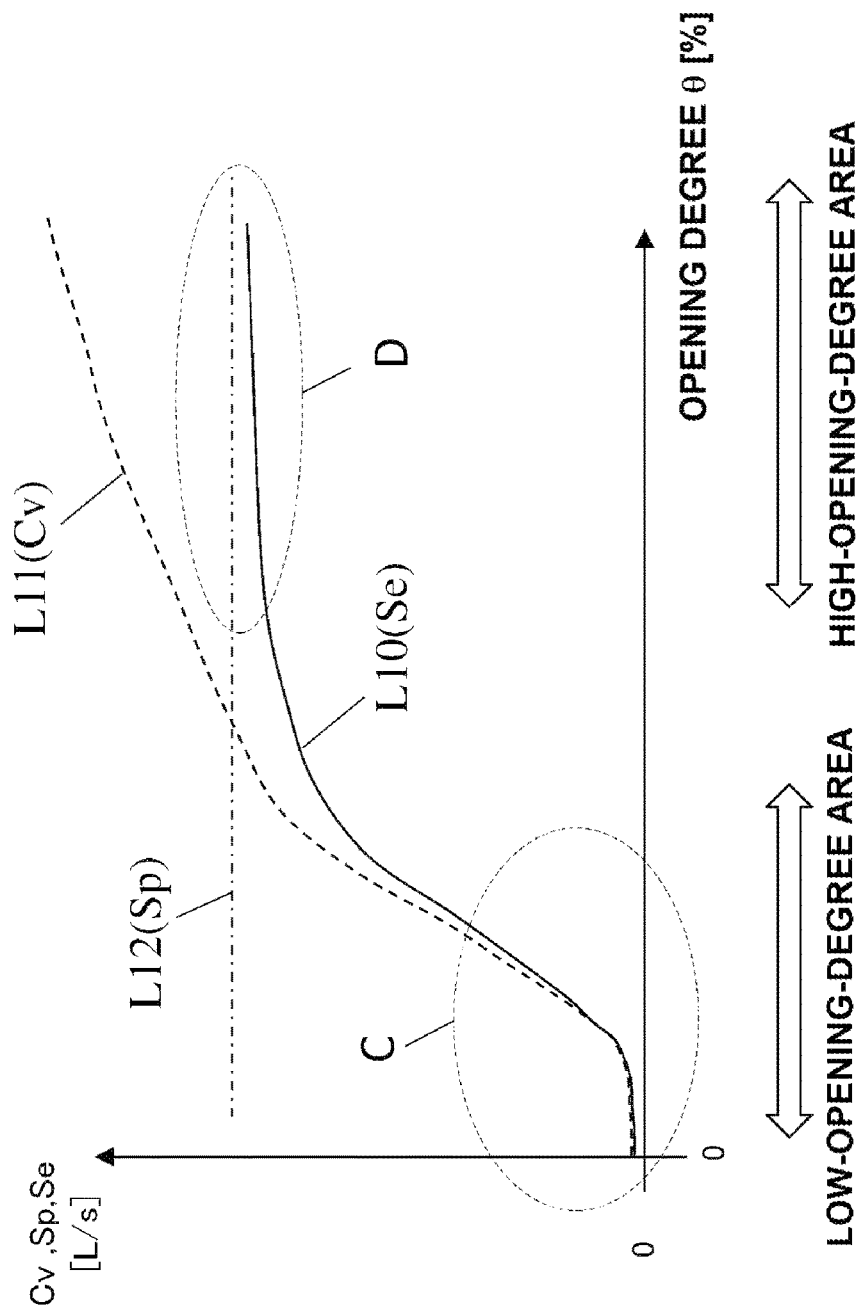
FIG. 5 is a graph showing the gradient of the effective exhaust speed Se(θ) in a low-opening-degree area and a high-opening-degree area.

The relationship between the opening degree $\theta$ and the effective exhaust speed $Se(\theta)$ generally shows a trend as in FIG. 5. That is, for the effective exhaust speed $Se(\theta)$ indicated by a line L10, the conductance Cv (a line L11) of the vacuum valve 2 is dominant in an area C (a low opening degree) with a low opening degree $\theta$, and the exhaust speed Sp (a line L12) of the vacuum pump 3 is dominant in an area (a high opening degree) D with a high opening degree $\theta$.

Normally, under semiconductor process conditions, a gas flow may be taken as a molecular flow area in the low-opening-degree area with the low valve body opening degree $\theta$. It has been known that when the molecular weight of the injected gas type is M, the conductance $Cv(\theta)$ is in reverse proportion to $\sqrt{M}$. Thus, in the low-opening-degree area with the low valve body opening degree $\theta$, a relationship represented by Expression (2) below is satisfied between the effective exhaust speed Se of an optional gas type (the molecular weight M) and the effective exhaust speed $Se\_reference(\theta)$ of the reference gas type (a molecular weight M0).

$$Se(\theta)=(\sqrt{(M0/M)})\times Se\_\text{Reference}(\theta) \tag{2}$$

In Expression (2), $\sqrt{(M0/M)}$ represents a ratio between the effective exhaust speed $Se(\theta)$ and the effective exhaust speed $Se\_reference(\theta)$ of the reference gas type, and it is recognized that the gas type can be represented by such a ratio. Hereinafter, the gas type relative value a is defined by Expression (3) below.

$$\text{Gas Type Relative Value } a=\sqrt{(M0/M)}=Se(\theta)/Se\_\text{Reference}(\theta) \tag{3}$$

The gas type relative value a is a value greater than 1 in the case of gas lighter than the reference gas type and smaller than 1 in the case of gas heavier than the reference gas type. Note that the properties in the low-opening-degree area with the low valve body opening degree $\theta$ have been described above, but an opening degree range used in a normal process generally overlaps with the above-described low-opening-degree area. Thus, the low-opening-degree area will not be specifically noted in description below.

In some cases, in the vacuum valve 2, the type of gas to be injected and the gas flow rate are estimated to optimally achieve automatic pressure adjustment. For example, in a case where a control period for fixing the valve body opening degree to a certain opening degree position is provided at the initial stage of the transient response period, in which the previous process event ends and the current process event starts, of the chamber pressure Pc, the gas type and the gas flow rate can be estimated in such a period. Normally, injected gas substitution is promptly completed by the flow rate controller 4 in time sufficiently shorter than the above-described valve body opening degree fixing period. Thus, in a case where the period in which the valve body opening degree θ is fixed is provided, it may be assumed that the effective exhaust speed Se is, except for the initial stage of such a period, also a constant value Se0 because the gas type, the flow rate, and the opening degree are constant. In this case, Exhaust Expressions (4A) and (4B) are satisfied at optional time points t1, t2 during the period in which the valve body opening degree θ is fixed, except for the above-described initial stage. When Se0 is eliminated from Expressions (4A) and (4B), the gas flow rate Qin can be estimated according to Expression (5) below.

$$Qin = V \times dPr1/dt + Se0 \times Pr1 \quad (4A)$$

$$Qin = V \times dPr2/dt + Se0 \times Pr2 \quad (4B)$$

$$Qin = V \times (Pr2 \times dPr1/dt - Pr1 \times dPr2/dt)/(Pr2 - Pr1) \quad (5)$$

Moreover, according to Expressions (4A) and (4B), the effective exhaust speed Se0 is represented by Expression (6) below.

$$Se0 = -V \times (dPr2/dt - dPr1/dt)/(Pr2 - Pr1) \quad (6)$$

In Expressions (4A), (4B), (5), and (6), Pr1 and Pr2 are pressure measurement values at t=t1 and t2, and dPr1/dt and dPr2/dt are the rates of temporal change in the pressure measurement values at t=t1 and t2. V is a chamber volume. Note that the chamber volume value V is, for optimization of automatic pressure adjustment, normally measured and acquired in advance by a calibration process performed only once upon installation for attaching the vacuum valve 2 to the vacuum chamber.

The effective exhaust speed Se0 calculated according to Expression (6) is an effective exhaust speed at the fixed valve body opening degree θ. The effective exhaust speed Se0 for which the gas type is unknown is represented as in Se0(θ)=a×Se_Reference(θ) by means of the effective exhaust speed Se_reference(θ) of the reference gas type and the gas type relative value a. Using Expression (6), the gas type relative value a is represented by Expression (7) below.

$$a = -(V/Se\_Reference(\theta)) \times (dPr2/dt - dPr1/dt)/(Pr2-Pr1) \quad (7)$$

One estimation value of (a, Qin) calculated in the transient state during such pressure adjustment control can be directly employed as (a, Qin), or can be applied as the reference gas equivalent flow rate Qin_a. However, estimation is performed in a dynamic process which is the transient state, and for this reason, an error is generally great. Thus, the following strategy is applied for reducing the error.

Figure 6:
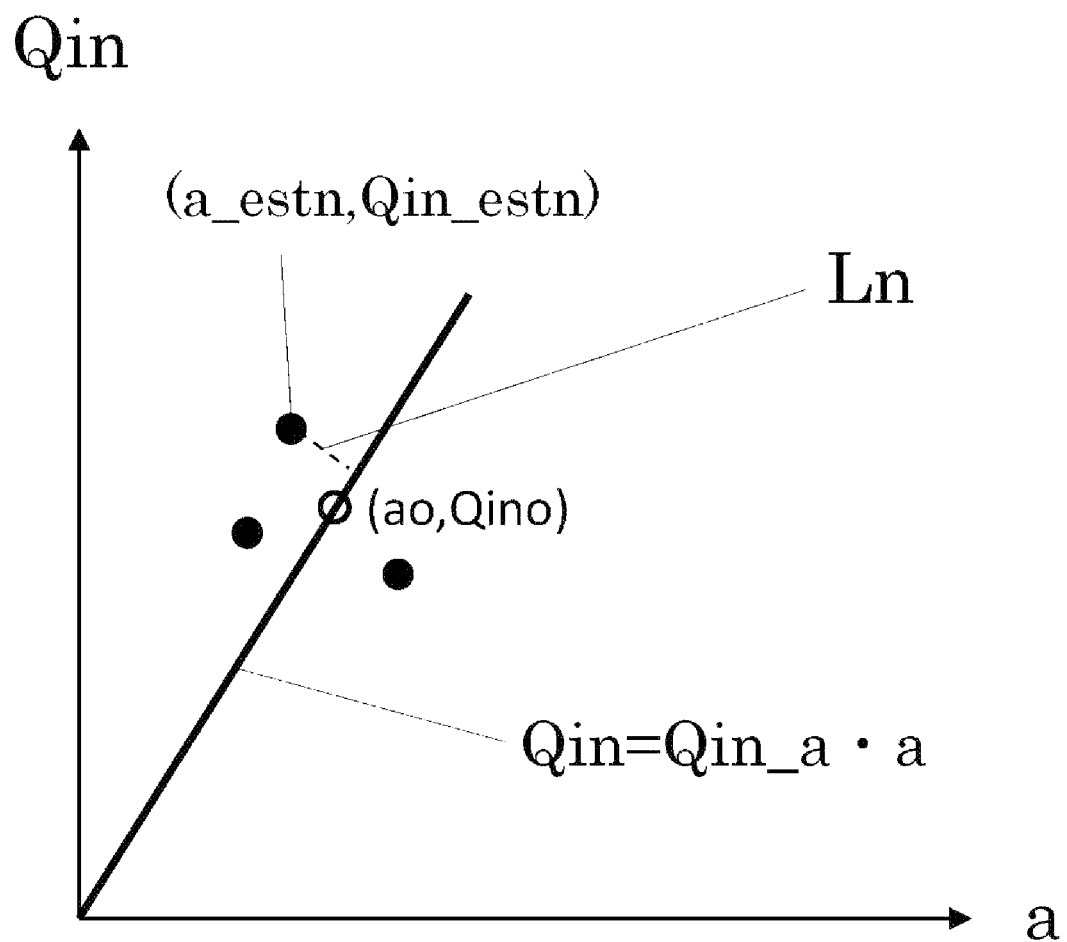
FIG. 6 is a graph for describing the method for calculating (ao, Qino)

In a case where there are multiple (N) estimation values of (a, Qin) acquired in the transient state upon pressure adjustment, these values are represented as (a_est1, Qin_est1), (a_est2, Qin_est2), (a_estk, Qin_estk), ..., (a_estN, Qin_estN) where k=1, 2, ..., N. In the process event effective as data, the equilibrium state is inevitably brought at the end, and the reference gas equivalent flow rate Qin_a can be obtained by Se_Reference(θ)×Ps. Thus, in a Qin-a plane shown in FIG. 6, the equilibrium state is represented by a dot on Line Qin=Qin_a×a, and the above-described N estimation values are scattered around the line.

Thus, it can be said that a point (ao, Qino) on the line is an optimal point, the square sum (ΣLk^2) of a distance Lk between the line and each estimation point (a k-point) being minimum at the point (ao, Qino). For obtaining such a point, the method of Lagrange multiplier may be applied as a constraint Qino=Qin_a×ao. When the system of equations in which F=(ΣLk^2)+λ(Qino−Qin_a×ao) is partially differentiated using ao, Qino, and a Lagrange multiplier A to obtain zero is solved, Expressions (8A) and (8B) are obtained.

$$ao = \Sigma\{Qink + (1/Qin\_a) \times ak\} / \{N \times (Qin\_a + 1/Qin\_a)\} \quad (8A)$$

$$Qino = Qin\_a \times ao \quad (8B)$$

This (ao, Qino) can be applied as the gas type relative value and the gas flow rate for the process event. When (ao, Qino) shows a significant change between the previous event and the current event, it can be determined that the current event ends even if there is no change in Qin_a.

(1-4. Reference Gas Equivalent Flow Rate Qin_a)

Generally, in the normal process, multiple types of gas are injected, and the flow rate varies according to the gas type. In a case where a gas mixture including multiple types of gas is injected, an exhaust expression shown as Expression (9) below is satisfied for each type of gas. That is, the exhaust expression in the case of the gas mixture is a combination of the exhaust expressions for the gas types contained in the gas mixture. Expression (9) represents exhaust expressions for N gas types (k=1, 2, 3, ..., N), and Qink, Pk, and Sek(θ) represent the gas flow rate, a pressure (a partial pressure), and the effective exhaust speed for the gas type k and V represents the chamber volume. Moreover, dPk/dt represents the time derivative of the pressure Pk. The effective exhaust speed Sek(θ) of the gas type k is represented as in Expression (10) below by means of the gas type relative value ak of the gas type k with respect to the reference gas.

$$Qink = V \times dPk/dt + Sek(\theta) \times Pk \quad (9)$$

$$Sek(\theta) = ak \times Se\_Reference(\theta) \quad (10)$$

Expression (11) below is obtained in such a manner that both sides of each of the N exhaust expressions for the N gas types (k=1, 2, 3, ..., N) represented by Expression (9) are divided by ak, the left-hand sides are added up, and the right-hand sides are added up.

$$\Sigma(Qink/ak) = V \times \Sigma(dPk/dt/ak) + Se\_Reference(\theta) \times \Sigma(Pk) \quad (11)$$

$$k = 1, 2, \ldots, N$$

In Expression (11), (Pk) is the sum of the partial pressures, and therefore, is the chamber pressure Pc measured by the vacuum meter 5. Expression (11) is an expression regarding the gas mixture. In a case where the gas mixture represented by the relationship of Expression (11) is taken as an average single gas type having a gas type relative value a_total, an expression corresponding to Expression (11) is represented as in Expression (12) below.

$$Qin\_total/a\_total = V \times dPc/dt/a\_total + Se\_Reference(\theta) \times Pc \quad (12)$$

In Expression (12), Qin_total corresponds to the flow rate of the gas mixture, and therefore, Qin_total=ΣQink and Left-Hand Side=ΣQink/a_total are satisfied. Assuming herein that the left-hand side of Expression (12) corresponds to the left-hand side of Expression (11) and these left-hand sides are equal to each other, $\Sigma(Qink/ak)=\Sigma Qink/a\_total$ is obtained. That is, the gas type relative value a_total of the average single gas type equivalent to the gas mixture is represented by Expression (13) below.

$$a\_total=\Sigma Qink/\Sigma(Qink/ak) \qquad (13)$$

Specifically, in the pressure equilibrium state, $dPk/dt=0$ ($k=1, 2, \ldots, K$) is satisfied. Thus, in the pressure equilibrium state, Expressions (11) and (12) are each represented as in Expressions (14) and (15).

$$\Sigma(Qink/ak)=Se\_Reference(\theta)\times\Sigma(Pk)(k=1,2,\ldots,N) \qquad (14)$$

$$Qin\_total/a\_total=Se\_Reference(\theta)\times Pc \qquad (15)$$

The right-hand sides of Expressions (14) and (15) are the product of the reference gas effective exhaust speed and the pressure in any case, and therefore, Qin_total/a_total ($=\Sigma$(Qink/ak)) on the left-hand side can be interpreted as the reference gas equivalent gas flow rate. Hereinafter, Qin_total/a_total ($=\Sigma(Qink/ak)$) is represented as the reference gas equivalent flow rate Qin_a. The reference gas equivalent flow rate Qin_a is defined by Expression (16) below.

$$Qin\_a=Qin\_total/a\_total(=\Sigma(Qink/ak)) \qquad (16)$$

In a case where the flow rate of a gas type lighter than the reference gas is dominant in the process gas (the gas mixture), Qink/ak for the lighter gas type is dominant in $\Sigma(Qink/ak)$. Thus, Qin_a is an approximate value obtained by division of Qin_total by the gas type relative value ak for the lighter gas type, and Qin_a shows a decreasing trend. Conversely, in a case where a heavier gas type is dominant, Qin_a shows an increasing trend. Thus, the reference gas equivalent flow rate Qin_a represented by Expression (16) will be, including not only the gas mixture but also the single gas type, hereinafter employed as one index (the process gas condition) of gas characteristic values including the gas flow rate and gas type information. Note that Qin_total and a_total represented by $Qin\_total=\Sigma Qink$ and $a\_total=\Sigma Qink/\Sigma(Qink/ak)$ will be hereinafter represented as Qin and a, including not only the case of the gas mixture but also the case of the single gas type. That is, Expression (16) is represented as in Expression (17) below.

$$Qin\_a=Qin/a(=\Sigma(Qink/ak)) \qquad (17)$$

The reference gas equivalent flow rate Qin_a is the gas characteristic value defined by Qin_total/a_total, and therefore, increases not only in a case where the gas flow rate increases but also in a case where the average gas type becomes heavier and a_total decreases. That is, an increase in the gas flow rate and an increase in the average molecular weight M are shown as an increase in the reference gas equivalent flow rate Qin_a, and a decrease in the gas flow rate and a decrease of the average molecular weight M are shown as a decrease in the reference gas equivalent flow rate Qin_a.

As in description of the event time length Time_spn above, almost no deviation from the equilibrium state is caused in a case where the target pressure Ps is unchanged and constant even when the process event changes and a change in the injected gas is small due to a change in the process event, and in some cases, the start or end of the process event cannot be estimated. Even in these cases, the end of the event can be determined from a change in the reference gas equivalent flow rate Qin_a in some cases.

Even if there is no change in the target pressure value, when the gas type and the gas flow rate change (due to a change in the process event), i.e., when the previous event ends and the current event starts, automatic pressure adjustment is performed such that the vacuum valve 2 holds the chamber pressure Pc at the constant target pressure Ps. As a result, the valve body opening degree $\theta$ generally changes from that in the previous event. By such an opening degree change, the start or end of the process event can be determined. According to Expressions (15) and (16) as described above, $Qin\_a=Se\_Reference(\theta)\times Ps$ is satisfied in such an equilibrium state of each process event that the target pressure Ps is constant. Eventually, a change in the valve body opening degree $\theta$ is shown as a change in Qin_a. The reference gas equivalent flow rate Qin_a calculated based on the valve body opening degree $\theta$ and the target pressure Ps can be applied as information on the gas type and the gas flow rate in the process event. Even when there is no deviation from the equilibrium state between the process events, the end of the event can be determined according to a change in the value of Qin_a.

(1-5. Recommended Measurement Timing Information flag_OK)

A case where the motor current value Im of the vacuum pump 3 (e.g., the turbo-molecular pump) is measured by the vacuum pump 3 itself and such data is sequentially transmitted to the estimation device 6 will be discussed. In a case where there is such an injected gas change that the gas load extremely increases at the start of the current event period, a rotor rotation speed temporarily decreases from a rated rotation speed due to a lack of torque, and thereafter, returns to the rated rotation speed. At this point, the motor current value Im rapidly increases and overshoot occurs, and thereafter, the motor current value Im converges to a current value greater than that before the change. The motor current value changes during the event period as described above, and therefore, as a representative value of the process event, a measurement value is preferably ensured in the equilibrium state at the target pressure Ps.

The recommended measurement timing information flag_OK is an index indicating that the equilibrium state at the target pressure Ps has been substantially brought. In the case of Recommended Measurement Timing Information flag_OK=1, such timing is preferable measurement timing in the equilibrium state. On the other hand, in the case of Recommended Measurement Timing Information flag_OK=0 (a non-equilibrium state), such timing is not preferable as the measurement timing, and the motor current value Im measured at such timing is not employed as the motor current value Im for accumulation amount determination. As one example of the recommended measurement timing information flag_OK, it is determined as the equilibrium state when the chamber pressure Pc is in Ps±0.02 Ps, i.e., a range of ±2%, for five seconds, and the flag value flag_OK changes from 0 to 1.

Figure 7:
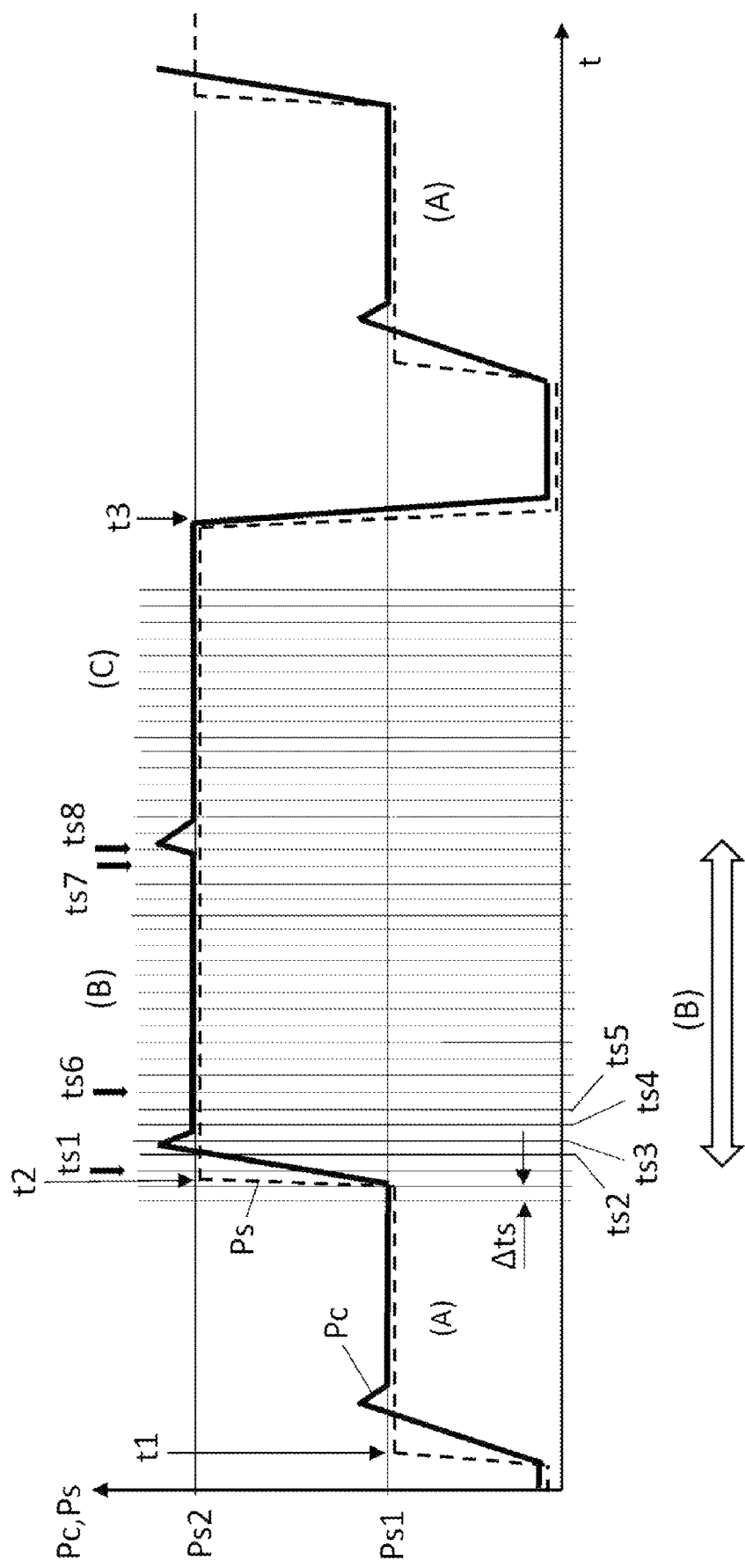
FIG. 7 is a graph for describing a relationship between motor current value measurement timing and a process information data set.

FIG. 7 is a graph for describing a relationship between the timing of measuring the motor current value Im and the process information data set, and shows a line (a dashed line) indicating the target pressure Ps similar to that of FIG. 3 and a line (a solid line) indicating the chamber pressure Pc. Transition of a data set [Ps, Time_spn, flag_OK] will be discussed herein. $\Delta ts$ is the time interval of the arithmetic processing for estimation. Generally, $\Delta ts$ is preferably short time, but for the sake of simplicity in description, description will be made assuming that $\Delta ts=3$ seconds is satisfied and ts1 to ts8 are provided as time associated with the process event B. The start/end of the event time length Time_spn is the timing of changing the target pressure Ps or the timing of deviation from the equilibrium state. That is, the timing of changing the target pressure Ps, i.e., the timing (ts1 of FIG. 7) of changing the target pressure Ps from Ps1 to Ps2, is employed as the start of the process event B, and the timing of deviation from the equilibrium state, i.e., deviation timing (ts8 of FIG. 7), is employed as the end of the process event B.

The target pressure Ps is estimated as Ps2 at least between t=ts1 and t=ts8. The target pressure initially reaches Ps=Ps2 at t=ts1, and therefore, such timing is the start time. Moreover, the chamber pressure Pc initially deviates from the equilibrium state at around Ps at t=ts8, and therefore, such timing is the end time. The event time length Time_spn is the value obtained by subtraction of the start time from the current time as described above, and therefore, tentative values such as Time_spn=ts3−ts1 at the measurement timing ts3 and Time_spn=ts7−ts1 at the measurement timing ts7 are estimated. When the time reaches the end time ts8, Event Time Length Time_spn of Process Event B=ts8−ts1 is fixed, and the entire data regarding the event time length Time_spn from the measurement timing ts1 to the measurement timing ts8 is updated from the tentative value to Fixed Value=Time_spn=ts8−ts1.

The recommended measurement timing information flag_OK is set to flag_OK=0 at ts1 to ts5 because the chamber pressure Pc deviates (Deviation Condition=shorter than five seconds at around Ps2) from the process pressure Ps, and is set to flag_OK=1 at ts6 and ts7 because of the equilibrium state (Equilibrium Condition=equal to or longer than five seconds at around Ps2). Moreover, the recommended measurement timing information flag_OK is set to flag_OK=0 at ts8 as the end time because the chamber pressure Pc deviates (shorter than five seconds at around Ps2) from Ps2 again.

Thus, the process information data sets [Ps, Time_spn, flag_OK] at the measurement timing ts1 to ts8 are [Ps2, ts8−ts1, 0], [Ps2, ts8−ts1, 0], [Ps2, ts8−ts1, 0], [Ps2, ts8−ts1, 0], [Ps2, ts8−ts1, 0], [Ps2, ts8−ts1, 1], [Ps2, ts8−ts1, 1], and [Ps2, ts8−ts1, 0] in this order. In this case, it can be said that the motor current value Im measured between the measurement timing ts6 and the measurement timing ts7 at which the recommended measurement timing information flag_OK is 1 is data which can be used for accumulation amount evaluation.

[3. Generation of Accumulation Information Data Set]

As described above, the estimation device 6 generates the process information data set [a, Qin, Ps, Time_spn, flag_OK] or [Qin_a, Ps, Time_spn, flag_OK] as the set of the multiple process gas conditions. The recommended measurement timing information flag_OK is the index indicating whether or not the equilibrium state has been brought. For example, in a case where the process event ends due to a change in the setting of the target pressure Ps without the equilibrium state being brought, flag_OK is not ON, and therefore, it is determined that the motor current value Im in this case is not a recommended value.

Further, the estimation device 6 generates the accumulation information data set by addition of the state characteristic value input from the vacuum pump 3, such as the motor current value Im which is the state characteristic value for accumulation amount evaluation, to the generated process information data set. Not only the motor current value Im but also measurement time Time_msr are constantly transmitted and input from the vacuum pump 3, and therefore, the measurement time Time_msr is also added to the accumulation information data set and the accumulation information data set is represented as in [a, Qin, Ps, Time_spn, flag_OK; Im, Time_msr] or [Qin_a, Ps, Time_spn, flag_OK; Im, Time_msr].

Note that the event start time or end time may be used instead of the measurement time Time_msr. The end timing of the event time length Time_spn is unknown and suddenly comes, needless to say. Thus, five previous data sets in a case where the flag of flag_OK is ON are, for example, tentatively stored at an interval of 1 second. When the end of the event is determined, only one of the temporarily-stored data sets is stored and the remaining sets are discarded. A similar process is also repeatedly performed for the subsequent process event. For example, in an example shown in FIG. 7, an interval of 3 seconds is employed, and therefore, two previous data sets are tentatively stored. The end of the event is determined as t=ts8, and one of the two previous data sets tentatively stored as data sets with flag_OK=1 and including the measurement timing ts7 is stored. In accumulation amount evaluation, it may only be required that a temporal change in the motor current value Im is known. Thus, multiple pieces of data are not necessary as accumulation data for a single process event, and as described above, it is enough to store a single data set of which flag of flag_OK is ON.

Note that the data set (the process information data set and the accumulation information data set) for the process event is fixed at the end of the event, and therefore, such a fixed data set (the process information data set or the accumulation information data set) is transmitted and output to each type of peripheral component equipment as necessary. In the case of the configuration shown in FIG. 1, the estimation device 6 performs not only generation of the accumulation information data set but also evaluation and determination of product accumulation, and therefore, output to other types of peripheral component equipment is not necessary.

(Data Set to be Stored and Saved)

A monitoring period in preventive maintenance is about several months to several years, and description will be made herein assuming that the monitoring period is one year. The event time length Time_spn of each process event for acquiring the data set increases as a hole becomes narrower and deeper in the case of an etching step, and increases as a precise film thickness increases in the case of a film formation step. The event time length Time_spn varies from several seconds to several tens of minutes. For example, in a case where it is assumed that the event time length Time_spn is 60 seconds, the number of data sets in continuous operation for one year is about half a million. In a case where the data sets are managed by, e.g., a dedicated PC, the entire data can be saved. However, in a case where the data is stored and saved in component equipment such as the vacuum valve 2 or the vacuum pump 3, there is a high probability that a tight restriction is on a storage amount. In such a case, a classification extraction process may be performed from moment to moment after classification frameworks as multiple classes have been determined in advance, unextracted data sets may be discarded, and only classification-extracted data sets may be stored saved.

[4. Classification Extraction of Data Set]

The data set fixed for each process event is accumulated in the storage section of the estimation device 6. The estimation device 6 classification-extracts data sets applicable as the classification framework taken as the same process condition from many fixed process event data sets accumulated previously and currently.

(4-1. Case of Determination of Class Classification Framework under Single Process Gas Condition)

In a case where the classification framework taken as the same process condition is determined, a classification framework highly associated with product accumulation is preferable. Etching gas is normally heavy gas, and shows a higher correlation with product accumulation as the gas flow rate increases, i.e., the reference gas equivalent flow rate Qin_a increases. Thus, evaluation needs to be performed under a condition where the reference gas equivalent flow rate Qin_a is high. However, the process conditions vary according to an end user, and for this reason, there is a probability that the number of pieces of data collected by classification is extremely small when only data sets with high reference gas equivalent flow rates Qin_a are targeted. Thus, multiple evaluation target classes with relatively-high reference gas equivalent flow rates Qin_a are preferably taken as classification frameworks.

For example, one framework regarding the reference gas equivalent flow rate Qin_a is Qin_a_1, and is generated with a framework range of ±ratio×Qin_a_1. In the case of the example shown in FIG. 3, when, e.g., Qin_a_C regarding the process C is within a framework range among the reference gas equivalent flow rates Qin_a obtained in the process events and Qin_a_A and Qin_a_B regarding the processes A, B are outside framework ranges, only the data set of the process C acquired in the equilibrium state is classified and extracted.

In a case where the gas type relative value a and the gas flow rate Qin are used instead of the reference gas equivalent flow rate Qin_a, the framework range of (a, Qin) may be, for example, set as in ±ratio×a and ±ratio×Qin where ratio is 0<ratio<1 and is normally about 0.1 to 0.2. A fixed data set group classified as one framework is arranged in chronological order, and it can be determined that the maintenance timing has come when the data group of the motor current values Im arranged in chronological order substantially monotonically increases and exceeds the predetermined threshold.

Note that in a case where a trend shows that the data group rapidly decreases without monotonically increasing and increases again regardless of a proper classification framework, it can be evaluated and analyzed that there is a high probability that peripheral maintenance such as replacement of the vacuum pump 3 is performed in the middle. Alternatively, not only the extracted data group is directly evaluated as described above, but also an optimal trend line (or curved line) may be generated from regression analysis and the necessity of maintenance may be determined based on whether or not such a line has reached a predetermined threshold as in a typical technique.

In the turbo-molecular pump, the pump rotor 32 rotating at a high speed close to a sound speed generates heat due to collision with gas molecules, but releases heat by heat emission to an opposing stator side. When the product accumulation amount increases, heat release properties are degraded due to adhesion of the product to the pump rotor 32 and a stator surface, and a rotor temperature increases accordingly. That is, it can be said that the rotor temperature is also a state characteristic value with a high correlation with the product accumulation amount. Thus, in a case where the vacuum pump 3 is equipped with a rotor temperature sensor configured to measure the temperature of the pump rotor 32, the rotor temperature can be also employed as the state characteristic value for evaluating the product accumulation amount instead of the motor current value Im. In this case, data sets regarding the rotor temperature are acquired and classified similarly so that evaluation of a temperature increasing trend and state determination by comparison with a threshold can be performed. Further, evaluation and determination are performed using both state characteristic values of the motor current value Im and the rotor temperature so that the accuracy of evaluation and determination of the product accumulation degree can be further improved.

(Indications of Classification Frameworks for Gas Type Relative Value a and Gas Flow Rate Qin)

Indications of the classification frameworks for the gas type relative value a and the gas flow rate Qin will be described. For example, in the etching process, etching gas is injected using Ar gas (M=40) as diluted gas. For example, in a case where the etching gas is $SF_6$ (Molecular Weight M=142) or $C_4F_8$ (Molecular Weight M=200), if the Ar gas is the reference gas, the gas type relative value a is a=0.53 or a=0.45 according to Expression (3). Normally, the molecular weight of the etching gas is equal to or greater than that of the Ar gas, and therefore, the classification framework for the gas type relative value a needs to be at least a<1. For the gas flow rate Qin, the indication of the classification framework is around several hundreds of sccm in a process chamber equipped with a 3000 L/S-class turbo-molecular pump.

(Influence of Product Accumulation and Classification Framework)

The gas type relative value a or the reference gas equivalent flow rate Qin_a influenced by the gas type will be discussed. As described above, in the normal process, the equilibrium state is brought in the low-opening-degree area with the low valve body opening degree θ of the vacuum valve 2, and the value of the effective exhaust speed in this state can be substantially taken as the valve conductance value. For example, in the case of Valve Conductance Cv=200 L/s at Pump Exhaust Speed Sp=2000 L/s, the effective exhaust speed Se is 182 L/s (=1/(1/Sp+1/Cv)), and decreases by about 10% as compared to the case of only the conductance. An area within this level is taken as the low-opening-degree area. Thus, if a limitation to the low-opening-degree area is explicitly made, the valve body opening degree θ may be added to the event conditions (the data set), and a classification framework that such an opening degree is equal to or lower than a low opening degree value (e.g., equal to or lower than an opening degree of 10%) may be added.

As the product accumulation amount increases, the flow of gas tends to be blocked in the vacuum pump, and the motor current value increases for maintaining rated rotation. However, exhaust performance is degraded, and therefore, the pump exhaust speed Sp shows a decreasing trend. For example, in a case where the pump exhaust speed Sp decreases by about 10% and Sp=1800 L/s is satisfied, the effective exhaust speed Se is 180 L/s, and it can be seen that as compared to 182 L/s as described above, almost no influence is on the effective exhaust speed Se(θ). Assuming herein that product accumulation has extremely increased, action taken in a case where the decrement further increases will be discussed.

The gas type relative value a is calculated according to Gas Type Relative Value a=Se(θ)/Se_Reference(θ). In a case where the effective exhaust speed has decreased over time, the stored correlation data Se_reference(θ) value regarding the reference gas remains fixed even in this case, and therefore, the gas type relative value a to be estimated also decreases as the effective exhaust speed Se(θ) decreases. For example, in a case where the reference gas is Ar, a=1 is estimated when the Ar gas is injected in an initial state with no product accumulation, and as the effective exhaust speed changes over time due to product accumulation, the gas type relative value a is estimated as a value smaller than 1. From a relationship of Qin_a=Qin/a, the Qin_a value is estimated greater due to a temporal change in the effective exhaust speed.

The classification framework setting (Framework Range±ratio×a) also needs to be taken into consideration in association with such a change in the gas type relative value a due to a temporal change in the effective exhaust speed. In this case, for the framework range for the gas type relative value a, a negative deviation is set greater than a positive deviation. Note that for the framework range for the gas flow rate Qin, negative and positive deviations may be the same as each other. For the reference gas equivalent flow rate Qin_a, it is more proper to set a positive deviation greater than a negative deviation.

(4-2. Case of Determination of Class Classification Frameworks for Multiple Process Gas Conditions)

The case where the classification framework is determined only for the simplest process gas condition associated with the gas type or the gas flow rate has been described above, but multiple types of process gas conditions may be combined. For example, the classification framework may be provided for each of the gas type, the gas flow rate, the process pressure, and the event time length, and only data sets satisfying all classification frameworks may be extracted as data sets under the same process conditions. For example, when the conditions which are the same process pressure and the same event time length are employed, in a case where a manufacturing device is used for high-mix low-volume production, there is, as compared to the single condition, a higher probability that the process events are taken as those belonging to manufacturing of the substantially-same product. As a result, there is a high probability that the same unknown process environment conditions which cannot be estimated can be provided, and evaluation and determination can be performed with a higher accuracy.

(4-3. Case of Determination of Class Classification Framework for Combination of Multiple Event Conditions)

Not only the classification frameworks may be determined for the process conditions in a single event, but also may be determined for a combination of the process events of which process conditions vary according to the process event. Normally, an exposure/development step, the etching step, and the film formation step are cyclically performed for a single wafer. Thus, the etching step for the same wafer is performed multiple times. At a particular etching step of these multiple etching steps, the etching process normally progresses not under a single process condition but under multiple different process conditions. For example, the process conditions are changed as a hole or groove to be processed becomes deeper, and in this manner, the process is optimized. Thus, a combination of the process conditions is specified so that the data can be narrowed down to one for the particular etching step.

That is, a data set block including multiple data sets having a focused process condition combination pattern is classified and extracted, and only data sets targeted for evaluation and determination are classified and extracted from the data set block. The number of data sets to be stored and saved is small, but these data sets are carefully-selected data sets and the accuracy of evaluation and determination can be further improved.

[First Variation]

In the above-described embodiment, all of generation of the process information data set, generation of the accumulation information data set obtained by addition of the motor current value Im input from the vacuum pump 3 to the process information data set, extraction of the accumulation information data set used for accumulation amount determination, and determination of the accumulation amount based on the extracted accumulation information data set are performed in the estimation device 6. However, a fixed data set (a data set including only the process gas conditions), which includes no motor current value Im, for each process event is transmitted to the vacuum pump 3 or the vacuum valve 2 from the estimation device 6, the motor current value Im and the measurement time Time_msr are added to the fixed data set in the vacuum pump 3 or the vacuum valve 2, and such a data set is classified, extracted, and arranged in chronological order. In this manner, the accumulation amount can be determined.

As described above, the data set is fixed at the end of the event, and therefore, it may only be required that the vacuum pump 3 or the vacuum valve 2 adds the motor current value Im and the measurement time Time_msr to the fixed data set by the following process, for example. The estimation device 6 outputs a trigger signal to the vacuum pump 3 or the vacuum valve 2 every time a data set with flag_OK=1 is estimated. On a vacuum pump 3 side or a vacuum valve 2 side, the motor current value Im and the measurement time are updated and stored every time the trigger signal is input. When the end of the event is fixed and the fixed data set is input to the vacuum pump 3 or the vacuum valve 2 from the estimation device 6, the vacuum pump 3 or the vacuum valve 2 adds the stored motor current value Im and the stored measurement time to the fixed data and stores such data.

[Second Variation]

In the system configuration shown in FIG. 1, it is configured such that the estimation device 6 is connected in parallel with the vacuum pump 3 and the vacuum valve 2 via communication lines to acquire information from the vacuum pump 3 and the vacuum valve 2. However, the vacuum pump 3, the vacuum valve 2, and the estimation device 6 may be in a daisy chain connection via, e.g., RS485 communication such that these components are sequentially connected in a row. The motor current value Im of the vacuum pump 3 is transmitted to the estimation device 6 through the vacuum valve 2.

[Third Variation]

Figure 8A:
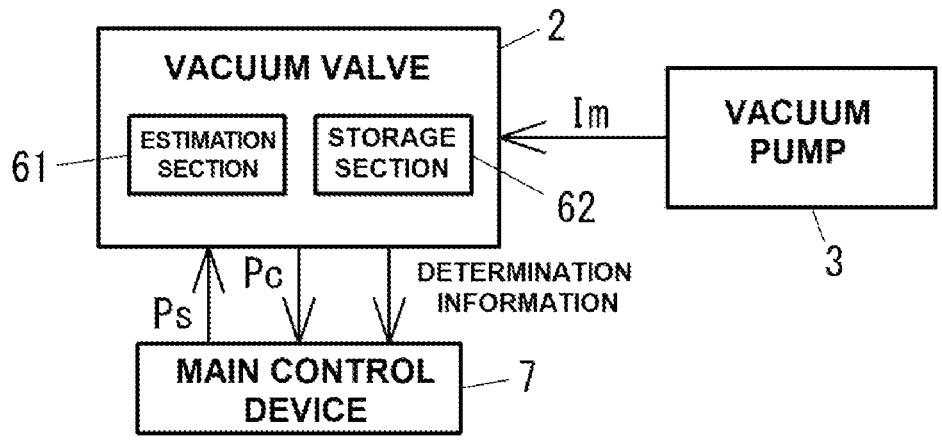
FIGS. 8A to 8C are diagrams showing configurations in a case where the function of an estimation device is provided at other devices, and show a case where the function is provided at a vacuum valve, a case where the function is provided at a vacuum pump, and a case where the function is provided at a main control device.

In the above-described embodiment, the estimation device 6 is independently provided, but an estimation function may be included in the vacuum valve 2 as shown in FIG. 8A. In this case, the product accumulation amount in the vacuum pump 3 may be evaluated in the vacuum valve 2, and such a determination result may be transmitted to the main control device 7 as in FIG. 8A or may be transmitted to the vacuum pump 3 to issue an alarm and a warning in the vacuum pump 3. Alternatively, only the process information data set excluding the state characteristic value targeted for evaluation may be generated in the vacuum valve 2 and transmitted to the vacuum pump 3. In the vacuum pump 3, the accumulation information data set may be generated from the received process information data set and the motor current value Im, and the product accumulation amount may be evaluated.

Figure 8B:
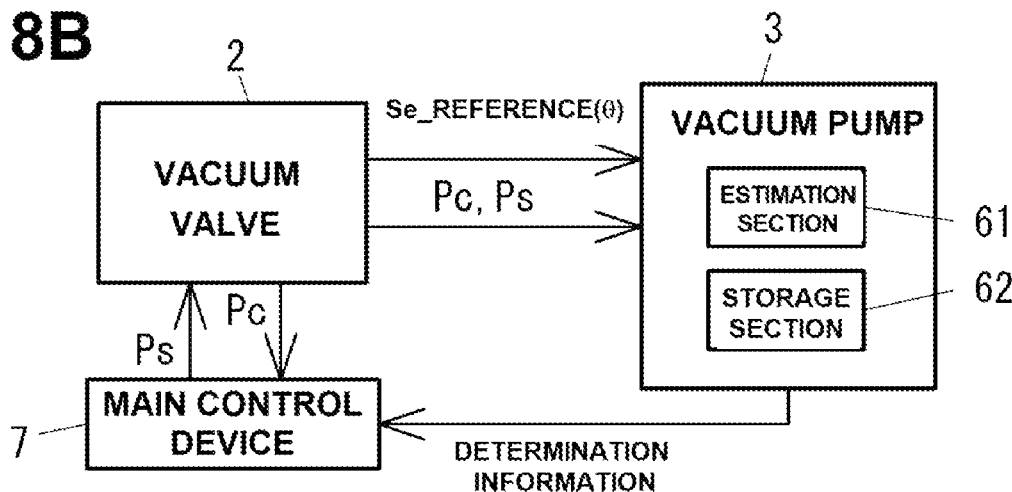
Figure 8C:
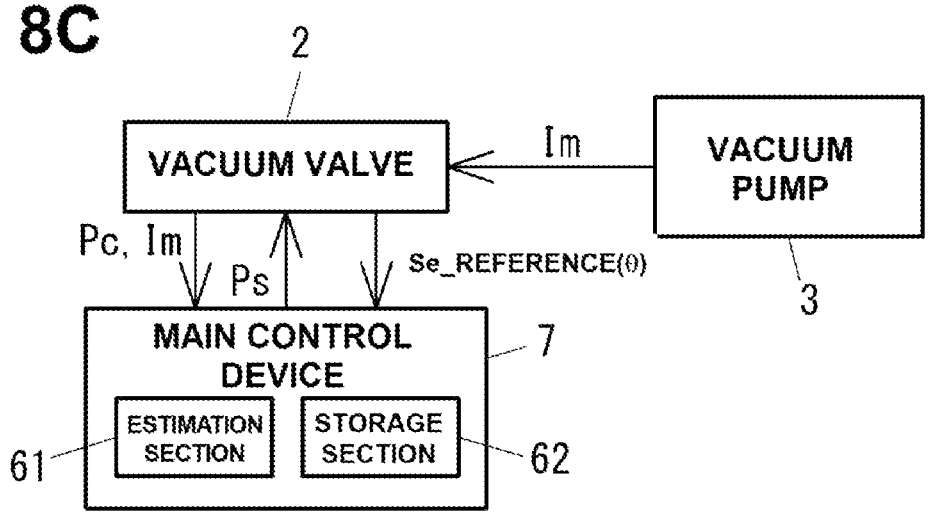

The estimation function may be included in the vacuum pump 3 as in FIG. 8B. In this case, the chamber pressure Pc, the target pressure Ps, and the correlation data Se_reference (θ) are input to the vacuum pump 3 from the vacuum valve 2, and the vacuum pump 3 evaluates the product accumulation amount and transmits such a determination result to the main control device 7. Alternatively, the estimation function may be included in the main control device 7 as in FIG. 8C. The chamber pressure Pc, the motor current value Im, and the correlation data Se_reference(θ) are input to the main control device 7 from the vacuum valve 2.

Second Embodiment

In the above-described first embodiment, the case where the product accumulation amount in the vacuum pump 3 is evaluated based on the motor current value Im as the state characteristic value of the vacuum pump 3 has been described. In evaluation of the product accumulation amount, the motor current value Im in the case of the same process gas conditions is monitored, and it is determined whether or not the motor current value Im has exceeded the predetermined threshold. Moreover, it has been also described that the rotor temperature can be used as the state characteristic value with the high correlation with the product accumulation amount in addition to the motor current value Im. Regarding maintenance of the vacuum pump 3, there is creep strain of the pump rotor 32 of the vacuum pump 3 in addition to the product accumulation amount. In a second embodiment, application to evaluation of such creep strain will be described.

It is important for safety operation of a vacuum pump 3 to monitor a creep strain amount of a pump rotor 32 in a vacuum pump 3 configured such that the pump rotor 32 rotates at a high speed. The creep strain amount of the pump rotor 32 depends on a rotor temperature and a stress due to centrifugal force, and such a stress depends on a rotor rotation number. A case where the rotor rotation number is within a predetermined rotation number range (e.g., a predetermined rotation number range including a rated rotation number) in which progress in the creep strain causes a problem will be discussed. It can be said that the creep strain amount is proportion to the time integration amount of the rotor temperature in a time range as the predetermined rotation number range. In a case where the time integration amount of the rotor temperature has reached a value equivalent to an acceptable value of the creep strain amount, it can be determined that a creep life comes (e.g., see JP-A-2018-3615).

(1. Rotor Rotation Number as State Characteristic Value)

As described above, in a case where the creep strain amount is evaluated according to the time integration amount of the rotor temperature, the time integration amount of the rotor temperature needs to be calculated only for time in a case where a rotor rotation number in a great-stress state is within the above-described predetermined rotation number range. Thus, for evaluating the creep strain amount according to the time integration amount of the rotor temperature, the rotor temperature and the rotor rotation number are necessary as state characteristic values of the vacuum pump 3. A turbo-molecular pump normally includes a rotation number sensor configured to detect the rotor rotation number, but in many cases, is equipped with no rotor temperature sensor. Thus, a reference gas equivalent flow rate Qin_a is used herein instead of the rotor temperature. That is, the creep strain amount can be evaluated even when no rotor temperature sensor is provided.

The rotor temperature increases as the value of the reference gas equivalent flow rate Qin_a as one of the above-described process gas conditions increases, and therefore, the reference gas equivalent flow rate Qin_a shows a high correlation with the rotor temperature. As in the time integration amount of the rotor temperature, the creep strain amount of the rotor increases as the time integration amount of the reference gas equivalent flow rate Qin_a increases. Thus, the rotor rotation number is, as the state characteristic value of the vacuum pump 3, input to an estimation device 6, and the reference gas equivalent flow rate Qin_a estimated by the estimation device 6 is utilized. In this manner, a time period in which the rotor rotation number is within the predetermined range can be determined according to the value of the reference gas equivalent flow rate Qin_a. Further, in the time period in which the rotor rotation number is within the predetermined range, the time integration amount of the reference gas equivalent flow rate Qin_a is obtained instead of the time integration amount of the rotor temperature so that the creep strain amount can be evaluated.

The state characteristic value is the rotor rotation number, the process gas condition for determining a recommended rotor rotation number (the above-described predetermined rotation number range) is the reference gas equivalent flow rate Qin_a, and it is determined that the rotor rotation number is within the predetermined rotation number range in a case where the value of the reference gas equivalent flow rate Qin_a is within a predetermined framework range. The estimation device 6 obtains the time integration amount of the reference gas equivalent flow rate Qin_a in the period determined as the rotor rotation number being within the predetermined rotation number range, determines that the creep strain life comes when the cumulative value of the time integration amount of the reference gas equivalent flow rate Qin_a has reached a creep strain life determination value, and issues an alarm and a warning.

(2. Creep Strain Evaluation Using Only Process Gas Conditions)

A case where the rotor rotation number is outside the predetermined rotation number range including the rated rotation number is, for example, a pump stop state or a point upon acceleration/deceleration at the time of start or stop of the pump. In any case, the value of the reference gas equivalent flow rate Qin_a is taken as zero. Thus, the time integration amount of the reference gas equivalent flow rate Qin_a is used as instead of the time integration amount of the rotor temperature Tr, and time integration is performed during a process with a great value of the reference gas equivalent flow rate Qin_a. In this manner, the time integration amount when the rotor rotation number is outside the predetermined rotation number range including the rated rotation number is automatically excluded. For determination during the process with the great value of the reference gas equivalent flow rate Qin_a, a recommended measurement timing information flag_OK as an index for whether or not an equilibrium state has been brought is used herein.

As described above, a data set of which recommended measurement timing information flag_OK included therein is flag_OK=0 is taken as an invalid data set, and is not included in a fixed data set for each process event. Note that it is assumed that the number of invalid data sets is slight as compared to the number of valid data sets in the process event in which a process is executed. For example, regarding a process event B from ts1 to ts8 in FIG. 7, data sets with flag_OK=0 at measurement timing ts1 to ts5 and ts8 are invalid data sets, and multiple data sets with flag_OK=1 at measurement timing ts6 to ts7 are valid data sets.

In the process event B, the time integration amount of the reference gas equivalent flow rate Qin_a in the case of using the valid data set is $(Qin\_a \times \Delta ts) \times (Time\_spn/\Delta ts - 2)$, and it can be said that such a time integration amount is substantially equal to $(Qin\_a \times \Delta ts) \times Time\_spn/\Delta ts = Qin\_a \times Time\_spn$. Thus, it can be said that the time integration amount $\Sigma(Qin\_a \times Time\_spn)$ of the reference gas equivalent flow rate Qin_a for all process events shows a high correlation with the creep strain amount, and the creep strain amount can be evaluated and determined using the time integration amount of the reference gas equivalent flow rate Qin_a. The estimation device 6 issues an alarm and a warning when the time integration amount of the reference gas equivalent flow rate Qin_a has reached a time integration amount equivalent to the creep life.

Note that the case where the reference gas equivalent flow rate Qin_a is obtained has been described above, but as long as a gas type relative value a is obtained based on Expression (8A), gas can be narrowed down to heavy gas having great influence on a creep strain increase based on whether or not the gas type relative value a is equal to or greater than that of Ar gas as reference gas. In this case, when the time integration amount of the reference gas equivalent flow rate Qin_a is accumulated only in a case where data sets are classified and extracted according not only to the magnitude of the reference gas equivalent flow rate Qin_a but also to a classification framework for gas heavier than the Ar gas, accuracy is further improved in data set classification.

Note that in the above-described first and second embodiments, a preventive maintenance target has been described as the TMP, but application to the dry pump is similarly allowed regarding product accumulation. Although the product is also accumulated in the vacuum valve 2 and the vacuum meter 5, the risk of such product accumulation increases as the reference gas equivalent flow rate Qin_a increases and the time integration amount of the reference gas equivalent flow rate Qin_a increases. Thus, it is useful for evaluation and determination.

Those skilled in the art understand that the above-described exemplary embodiments and variations are specific examples of the following aspects.

[1] An estimation device for estimating a process gas condition in a system for pumping gas from a vacuum chamber into which the gas is injected to perform a treatment process by a vacuum pump attached to the vacuum chamber through a vacuum valve, comprises: a computer having a processor and a memory, wherein the computer estimates a first process gas condition including an injected gas type and a gas flow rate based on correlation data between a valve body opening degree of the vacuum valve and an effective exhaust speed of the system regarding a predetermined gas type and a chamber pressure of the vacuum chamber.

In the estimation device 6, the reference gas equivalent flow rate Qin_a including the information on the gas type relative value a of the injected gas and the gas flow rate Qin is estimated based on the correlation data Se_reference($\theta$) between the valve body opening degree $\theta$ and the effective exhaust speed and the chamber pressure Pc. Using the estimated reference gas equivalent flow rate Qin_a as the process gas condition, the motor current value is classified and extracted so that a temporal change in the motor current value depending on product accumulation can be determined with a higher accuracy than that in a typical technique and the product accumulation amount can be more accurately determined.

[2] The computer includes a state determination section configured to determine whether or not the chamber pressure is in a state taken as an equilibrium state in which the chamber pressure has converged to a target pressure in a process, and the computer estimates the first process gas condition in the state taken as the equilibrium state.

The estimation section 61 functioning as a state determination section determines, according to the chamber pressure Pc, whether or not the equilibrium state has been brought, and therefore, the reference gas equivalent flow rate Qin_a in the equilibrium state can be easily estimated from the target pressure Ps and the correlation data Se_reference ($\theta$) at this point.

[3] The state determination section determines, in addition to determination of the state taken as the equilibrium state, whether or not the chamber pressure is in a pressure response transient state upon adjustment to the target pressure. The computer estimates multiple second process gas conditions equivalent to the injected gas type and the gas flow rate in the transient state. The computer estimates, based on the multiple second process gas conditions and the first process gas condition in the state taken as the equilibrium state, a third process gas condition equivalent to the injected gas type and the gas flow rate in the equilibrium state in which the chamber pressure has converged to the target pressure in the process.

The pressure response transient state can be estimated from the state of change in the chamber pressure Pc after Qin_a or the valve body opening degree $\theta$ has been changed. In this transient state, a third process gas condition (the gas type relative value ao, the gas flow rate Qino) is estimated from multiple second process gas conditions (the gas type relative value a, the gas flow rate Qin) and the reference gas equivalent flow rate Qin_a in the equilibrium state, and therefore, the accuracy of estimation of the gas type relative value and the gas flow rate is improved.

[4] The computer further estimates, as a fourth process gas condition, an event time length equivalent to time required for the treatment process and/or a process pressure.

The event time length Time_spn equivalent to the time required for the treatment process and/or the target pressure Ps are easily classified and extracted according to a fourth process gas condition even in the case of the multiple process events.

[5] The computer further estimates, as a fifth process gas condition, information indicating whether or not the chamber pressure is in the equilibrium state.

The recommended measurement timing information flag_OK is the index indicating whether or not the chamber pressure Pc is substantially in the equilibrium state, and the motor current value in the equilibrium state can be easily classified and extracted using the recommended measurement timing information flag_OK as the process gas condition.

[6] The computer estimates the first process gas condition and a fifth process gas condition indicating whether or not the chamber pressure is in the equilibrium state, generates, in chronological order, multiple data sets including the estimated process gas conditions and a state characteristic value indicating an operation state of the vacuum pump, extracts, from the multiple data sets, only a data set of which the fifth process gas condition indicates the equilibrium state, and sets, for a predetermined process gas condition or multiple predetermined process gas conditions of the multiple process gas conditions included in the extracted data set, a classification framework that the process gas condition is taken as a state substantially identical to a predetermined state and classifies the extracted data set as the classification framework.

Using the first process gas condition and a fifth process gas condition (the recommended measurement timing information flag_OK), the state characteristic value (the motor current value) in the equilibrium state in the same process event can be classified and extracted with a high accuracy.

[7] The computer estimates at least one of the first process gas condition, the second process gas conditions, and the third process gas condition and a fifth process gas condition indicating whether or not the chamber pressure is in the equilibrium state, generates, in chronological order, multiple data sets including the estimated process gas conditions and a state characteristic value indicating an operation state of the vacuum pump, extracts, from the multiple data sets, only a data set of which the fifth process gas condition indicates the equilibrium state, and sets, for a predetermined process gas condition or multiple predetermined process gas conditions of the multiple process gas conditions included in the extracted data set, a classification framework that the process gas condition is taken as a state substantially identical to a predetermined state and classifies the extracted data set as the classification framework.

Using at least one of the first process gas condition, the second process gas conditions, and the third process gas condition and the fifth process gas condition (the recommended measurement timing information flag_OK), the state characteristic value (the motor current value) in the equilibrium state in the same process event can be classified and extracted with a high accuracy.

[8] The computer estimates at least one of the first process gas condition or the fourth process gas condition and a fifth process gas condition indicating whether or not the chamber pressure is in the equilibrium state, generates, in chronological order, multiple data sets including the estimated process gas conditions and a state characteristic value indicating an operation state of the vacuum pump, extracts, from the multiple data sets, only a data set of which the fifth process gas condition indicates the equilibrium state, and sets, for a predetermined process gas condition or multiple predetermined process gas conditions of the multiple process gas conditions included in the extracted data set, a classification framework that the process gas condition is taken as a state substantially identical to a predetermined state and classifies the extracted data set as the classification framework.

Using at least one of the first process gas condition or the fourth process gas condition and the fifth process gas condition (the recommended measurement timing information flag_OK), the state characteristic value (the motor current value) in the equilibrium state in the same process event can be classified and extracted with a high accuracy.

[9] [10] [11] The state characteristic value is a current value of a motor configured to rotatably drive a pump rotor, and the computer arranges multiple data sets classified as an identical classification framework in chronological order, and estimates a product accumulation amount in the vacuum pump based on a temporal change in the state characteristic value included in the data sets arranged in chronological order.

The motor current value in the equilibrium state in the same process event can be classified and extracted with a high accuracy, and therefore, the product accumulation amount can be evaluated with a high accuracy.

[12] The computer generates, in chronological order, multiple data sets including the first process gas condition, an event time length, and the fifth process gas condition, extracts, from the multiple data sets, only a data set of which the fifth process gas condition indicates the equilibrium state, estimates a time integration amount of the first process gas condition based on the event time length and the fifth process gas condition included in the extracted data set, and evaluates a creep strain amount of a pump rotor of the vacuum pump based on the estimated time integration amount.

The creep strain amount is estimated only from the process gas conditions, and therefore, the creep strain in the vacuum pump including no temperature sensor can be easily evaluated.

[13] A vacuum valve provided between a vacuum chamber in which a treatment process is performed and a vacuum pump, comprises: the estimation device, wherein a product accumulation state in the vacuum pump is determined based on a product accumulation amount estimated by the estimation device.

The product accumulation amount is estimated by the estimation device, and therefore, the product accumulation amount in the vacuum pump can be easily evaluated with a high accuracy.

[14] A vacuum valve comprises: the estimation device. The computer acquires the first process gas condition, a fifth process gas condition indicating whether or not the chamber pressure is in the equilibrium state, and a state characteristic value indicating an operation state of the vacuum pump, generates, in chronological order, multiple data sets including the first process gas condition, the fifth process gas condition, and the state characteristic value indicating the operation state, extracts, from the multiple data sets, only a data set of which the fifth process gas condition indicates the equilibrium state, and sets, for a predetermined process gas condition or multiple predetermined process gas conditions of the multiple process gas conditions included in the extracted data set, a classification framework that the process gas condition is taken as a state substantially identical to a predetermined state and classifies the extracted data set as the classification framework.

The process gas conditions are input to the vacuum valve 2 from the estimation device 6, and the state characteristic value (the motor current value) is input to the vacuum valve 2 from the vacuum pump 3. In the vacuum valve 2, the state characteristic value is extracted and classified based on the process gas conditions. Thus, the state characteristic value can be extracted and classified with a higher accuracy.

[15] A vacuum pump comprises: a pump rotor to be rotatably driven by a motor; and the estimation device. A product accumulation state in the vacuum pump is determined based on a product accumulation amount estimated by the estimation device.

[16] A vacuum pump comprises: the estimation device. The computer acquires the first process gas condition and a fifth process gas condition indicating whether or not the chamber pressure is in the equilibrium state, generates, in chronological order, multiple data sets including the first process gas condition, the fifth process gas condition, and a state characteristic value indicating an operation state of the vacuum pump, extracts, from the multiple data sets, only a data set of which the fifth process gas condition indicates the equilibrium state, and sets, for a predetermined process gas condition or multiple predetermined process gas conditions of the multiple process gas conditions included in the extracted data set, a classification framework that the process gas condition is taken as a state substantially identical to a predetermined state and classifies the extracted data set as the classification framework.

The state characteristic value is extracted and classified based on the process gas conditions input from the estimation device. Thus, the state characteristic value can be extracted and classified with a high accuracy.

The various embodiments and the variations have been described above, and the present invention is not limited to the contents of these embodiments and variations. Other aspects conceivable within the scope of the technical idea of the present invention are also included in the scope of the present invention.

What is claimed is:

1. An estimation device for estimating a process gas condition in a system for pumping gas from a vacuum chamber into which the gas is injected to perform a treatment process by a vacuum pump attached to the vacuum chamber through a vacuum valve, comprising:
   a computer having a processor and a memory,
   wherein the computer estimates a first process gas condition including an injected gas type and a gas flow rate based on correlation data between a valve body opening degree of the vacuum valve and an effective exhaust speed of the system regarding a predetermined gas type and a chamber pressure of the vacuum chamber.

2. The estimation device according to claim 1, wherein
   the computer includes a state determination section configured to determine whether or not the chamber pressure is in a state taken as an equilibrium state in which the chamber pressure has converged to a target pressure in a process, and
   the computer estimates the first process gas condition in the state taken as the equilibrium state.

3. The estimation device according to claim 2, wherein
   the state determination section determines, in addition to determination of the state taken as the equilibrium state, whether or not the chamber pressure is in a pressure response transient state upon adjustment to the target pressure,
   the computer estimates multiple second process gas conditions equivalent to the injected gas type and the gas flow rate in the transient state, and
   the computer estimates, based on the multiple second process gas conditions and the first process gas condition in the state taken as the equilibrium state, a third process gas condition equivalent to the injected gas type and the gas flow rate in the equilibrium state in which the chamber pressure has converged to the target pressure in the process.

4. The estimation device according to claim 1, wherein
   the computer further estimates, as a fourth process gas condition, an event time length equivalent to time required for the treatment process and/or a process pressure.

5. The estimation device according to claim 1, wherein
   the computer further estimates, as a fifth process gas condition, information indicating whether or not the chamber pressure is in the equilibrium state.

6. The estimation device according to claim 1, wherein
   the computer
   estimates the first process gas condition and a fifth process gas condition indicating whether or not the chamber pressure is in the equilibrium state,
   generates, in chronological order, multiple data sets including the estimated process gas conditions and a state characteristic value indicating an operation state of the vacuum pump,
   extracts, from the multiple data sets, only a data set of which the fifth process gas condition indicates the equilibrium state, and
   sets, for a predetermined process gas condition or multiple predetermined process gas conditions of the multiple process gas conditions included in the extracted data set, a classification framework that the process gas condition is taken as a state substantially identical to a predetermined state and classifies the extracted data set as the classification framework.

7. The estimation device according to claim 3, wherein
   the computer
   estimates at least one of the first process gas condition, the second process gas conditions, and the third process gas condition and a fifth process gas condition indicating whether or not the chamber pressure is in the equilibrium state,
   generates, in chronological order, multiple data sets including the estimated process gas conditions and a state characteristic value indicating an operation state of the vacuum pump,
   extracts, from the multiple data sets, only a data set of which the fifth process gas condition indicates the equilibrium state, and
   sets, for a predetermined process gas condition or multiple predetermined process gas conditions of the multiple process gas conditions included in the extracted data set, a classification framework that the process gas condition is taken as a state substantially identical to a predetermined state and classifies the extracted data set as the classification framework.

8. The estimation device according to claim 4, wherein
   the computer
   estimates at least one of the first process gas condition or the fourth process gas condition and a fifth process gas condition indicating whether or not the chamber pressure is in the equilibrium state,
   generates, in chronological order, multiple data sets including the estimated process gas conditions and a state characteristic value indicating an operation state of the vacuum pump,
   extracts, from the multiple data sets, only a data set of which the fifth process gas condition indicates the equilibrium state, and
   sets, for a predetermined process gas condition or multiple predetermined process gas conditions of the multiple process gas conditions included in the extracted data set, a classification framework that the process gas condition is taken as a state substantially identical to a predetermined state and classifies the extracted data set as the classification framework.

9. The estimation device according to claim 6, wherein
   the state characteristic value is a current value of a motor configured to rotatably drive a pump rotor, and
   the computer arranges multiple data sets classified as an identical classification framework in chronological order, and estimates a product accumulation amount in the vacuum pump based on a temporal change in the state characteristic value included in the data sets arranged in chronological order.

10. The estimation device according to claim 7, wherein
    the state characteristic value is a current value of a motor configured to rotatably drive a pump rotor, and
    the computer arranges multiple data sets classified as an identical classification framework in chronological order, and estimates a product accumulation amount in the vacuum pump based on a temporal change in the state characteristic value included in the data sets arranged in chronological order.

11. The estimation device according to claim 8, wherein
    the state characteristic value is a current value of a motor configured to rotatably drive a pump rotor, and
    the computer arranges multiple data sets classified as an identical classification framework in chronological order, and estimates a product accumulation amount in the vacuum pump based on a temporal change in the state characteristic value included in the data sets arranged in chronological order.

12. The estimation device according to claim 5, wherein the computer generates, in chronological order, multiple data sets including the first process gas condition, an event time length, and the fifth process gas condition, extracts, from the multiple data sets, only a data set of which the fifth process gas condition indicates the equilibrium state, estimates a time integration amount of the first process gas condition based on the event time length and the fifth process gas condition included in the extracted data set, and evaluates a creep strain amount of a pump rotor of the vacuum pump based on the estimated time integration amount.

13. A vacuum valve provided between a vacuum chamber in which a treatment process is performed and a vacuum pump, comprising:

the estimation device according to claim 6, wherein a product accumulation state in the vacuum pump is determined based on a product accumulation amount estimated by the estimation device.

14. A vacuum valve comprising:

the estimation device according to claim 1, wherein the computer acquires the first process gas condition, a fifth process gas condition indicating whether or not the chamber pressure is in the equilibrium state, and a state characteristic value indicating an operation state of the vacuum pump, generates, in chronological order, multiple data sets including the first process gas condition, the fifth process gas condition, and the state characteristic value indicating the operation state, extracts, from the multiple data sets, only a data set of which the fifth process gas condition indicates the equilibrium state, and sets, for a predetermined process gas condition or multiple predetermined process gas conditions of the multiple process gas conditions included in the extracted data set, a classification framework that the process gas condition is taken as a state substantially identical to a predetermined state and classifies the extracted data set as the classification framework.

15. A vacuum pump comprising:

a pump rotor to be rotatably driven by a motor; and the estimation device according to claim 1, wherein a product accumulation state in the vacuum pump is determined based on a product accumulation amount estimated by the estimation device.

16. A vacuum pump comprising:

the estimation device according to claim 1, wherein the computer acquires the first process gas condition and a fifth process gas condition indicating whether or not the chamber pressure is in the equilibrium state, generates, in chronological order, multiple data sets including the first process gas condition, the fifth process gas condition, and a state characteristic value indicating an operation state of the vacuum pump, extracts, from the multiple data sets, only a data set of which the fifth process gas condition indicates the equilibrium state, and sets, for a predetermined process gas condition or multiple predetermined process gas conditions of the multiple process gas conditions included in the extracted data set, a classification framework that the process gas condition is taken as a state substantially identical to a predetermined state and classifies the extracted data set as the classification framework.

\* \* \* \* \*